United States Patent
Kim et al.

(10) Patent No.: US 12,245,476 B2
(45) Date of Patent: Mar. 4, 2025

(54) DISPLAY DEVICE

(71) Applicant: Samsung Display Co., Ltd., Yongin-si (KR)

(72) Inventors: Jaeik Kim, Yongin-si (KR); Hyejin Gwark, Yongin-si (KR); Arong Kim, Yongin-si (KR); Jungsun Park, Yongin-si (KR); Heemin Park, Yongin-si (KR); Yeonhwa Lee, Yongin-si (KR); Joongu Lee, Yongin-si (KR); Kyuhwan Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 481 days.

(21) Appl. No.: 17/737,132

(22) Filed: May 5, 2022

(65) Prior Publication Data

US 2023/0078043 A1    Mar. 16, 2023

(30) Foreign Application Priority Data

Sep. 16, 2021    (KR) .................. 10-2021-0124258

(51) Int. Cl.
  *H10K 59/13*     (2023.01)
  *H10K 59/122*    (2023.01)
  *H10K 59/131*    (2023.01)

(52) U.S. Cl.
  CPC ......... *H10K 59/131* (2023.02); *H10K 59/122* (2023.02)

(58) Field of Classification Search
  CPC ............ H10K 50/401–828; H10K 50/10–135; H10K 50/15–157; H10K 59/123;
  (Continued)

(56) References Cited

U.S. PATENT DOCUMENTS 8,354,980 B2    1/2013    Kwak
8,912,983 B2    12/2014   Kim
(Continued)

FOREIGN PATENT DOCUMENTS

KR    10-2011-0115694    10/2011
KR    10-2015-0042989    4/2015
(Continued)

OTHER PUBLICATIONS

Korean International Search Report for International Application No. PCT/KR2022/013884, dated Dec. 22, 2022.

*Primary Examiner* — Moin M Rahman
(74) *Attorney, Agent, or Firm* — KILE PARK REED & HOUTTEMAN PLLC

(57) ABSTRACT

A display device includes an auxiliary wiring located on a substrate; an insulating layer arranged on the auxiliary wiring, overlapping the auxiliary wiring in a plan view, and including an opening having a width greater than a width of the auxiliary wiring; a first electrode located on the insulating layer; a bank layer including an emission opening that overlaps the first electrode in a plan view; an intermediate layer overlapping the first electrode through an emission opening in a plan view and including an emission layer; a second electrode on the intermediate layer; and an auxiliary layer arranged on the second electrode, wherein the auxiliary wiring includes sub-layers, and each of the second electrode and the auxiliary layer contacts a side surface of one of the sub-layers through the opening of the insulating layer.

21 Claims, 18 Drawing Sheets

(58) Field of Classification Search
CPC .............. H10K 59/1201; H10K 59/122; H10K 71/00; H10K 59/1216; H10K 59/1213; H10K 59/80521; H10K 59/35; H10K 59/38; H10K 59/124; H10K 2102/00; H10K 2102/10; H10K 2102/101; H10K 2102/102; H10K 2102/103; H10K 2102/20; H10K 2102/301; H10K 2102/302; H10K 2102/3023; H10K 2102/3026; H10K 2102/3031; H10K 2102/3035; H10K 2102/311; H10K 2102/321; H10K 2102/331; H10K 2102/341; H10K 50/11; H10K 50/16; H10K 50/171; H10K 2101/30; H10K 2101/40; H10K 2102/351; H10K 50/852; H10K 59/12; H10K 50/156; H10K 2101/00; H01L 29/4908; H01L 29/66742–6678; H01L 29/786–78696; H01L 27/12–13; H01L 2924/13069; H01L 29/04–045; H01L 29/16–1608; H01L 29/18–185; H01L 29/22–2206; H01L 29/36–365; H01L 33/20; H01L 51/5209; H01L 27/322; H01L 27/3258; H01L 51/00; H01L 33/58; H01L 27/1248; H01L 33/505; H01L 29/78633; H01L 27/3244; H01L 51/5262; B60K 37/02; B60K 2370/1523; B60K 2370/331; B60K 2370/52; B60R 1/00

See application file for complete search history.

(56) References Cited

U.S. PATENT DOCUMENTS

| | | |
|---|---|---|
| 9,818,971 B2 | 11/2017 | Cheng et al. |
| 10,205,122 B2 | 2/2019 | Choi et al. |
| 10,403,861 B2 | 9/2019 | Lee et al. |
| 10,756,292 B2 | 8/2020 | Tang et al. |
| 2014/0159074 A1* | 6/2014 | Isobe ................... H10K 50/844 438/34 |
| 2021/0020725 A1 | 1/2021 | Park et al. |
| 2021/0036073 A1 | 2/2021 | Cho et al. |

FOREIGN PATENT DOCUMENTS

| | | |
|---|---|---|
| KR | 10-2015-0075188 | 7/2015 |
| KR | 10-2016-0017339 | 2/2016 |
| KR | 10-2017-0059864 | 5/2017 |
| KR | 10-2019-0079954 | 7/2019 |
| KR | 10-2020-0049223 | 5/2020 |
| KR | 10-2021-0009486 | 1/2021 |
| KR | 10-2021-0016145 | 2/2021 |

* cited by examiner

DISPLAY DEVICE

CROSS-REFERENCE TO RELATED APPLICATION

This application is based on and claims priority to and benefits of Korean Patent Application No. 10-2021-0124258 under 35 U.S.C. § 119, filed on Sep. 16, 2021, in the Korean Intellectual Property Office (KIPO), the entire contents of which are incorporated herein by reference.

BACKGROUND

1. Technical Field

One or more embodiments relate to a display device.

2. Description of the Related Art

In general, in display devices such as organic light emitting display devices, transistors are arranged in a display area so as to control the brightness of a light emitting diode. These transistors control a corresponding light emitting diode to emit light of a certain color by using a transmitted data signal, a driving voltage, and a common voltage.

A certain voltage may be applied to one of electrodes of the light emitting diode through the transistor, and a voltage may be applied to the other one of the electrodes of the light emitting diode through an auxiliary wiring.

As the ratio of a display area, in which an image may be provided, of a display device increases, a non-display area, as a dead space in which no light emitting diodes are arranged, needs to be reduced. As a space, in which components arranged in the non-display area are located, is decreased, the quality of light emitted from light emitting diodes may be lowered.

SUMMARY

One or more embodiments include a display device in which the area of a dead space may be reduced and a high quality image may be displayed. However, these objectives are examples, and the scope of the disclosure is not limited thereby.

Additional aspects will be set forth in part in the description which follows and, in part, will be apparent from the description, or may be learned by practice of the presented embodiments of the disclosure.

According to one or more embodiments, a display device includes an auxiliary wiring located on a substrate, an insulating layer arranged on the auxiliary wiring, overlapping the auxiliary wiring in a plan view, and including an opening having a width greater than a width of the auxiliary wiring, a first electrode located on the insulating layer, a bank layer including an emission opening that overlaps the first electrode in the plan view, an intermediate layer overlapping the first electrode through an emission opening in the plan view and including an emission layer, a second electrode located on the intermediate layer, and an auxiliary layer arranged on the second electrode. The auxiliary wiring includes sub-layers, and each of the second electrode and the auxiliary layer contacts a side surface of one of the plurality of sub-layers through the opening of the insulating layer.

The sub-layers of the auxiliary wiring may include a main sub-layer, an upper layer arranged on the main sub-layer and having a tip protruding from a part in which a side surface and an upper surface of the main sub-layer meet each other, and a lower layer arranged under the main sub-layer. Each of the second electrode and the auxiliary layer may directly contact the side surface of the main sub-layer.

The thickness of the main sub-layer may be greater than at least one of the thickness of the upper layer and the thickness of the lower layer.

The intermediate layer may overlap the first electrode and the auxiliary wiring in the plan view, and a portion of the intermediate layer may be located on the auxiliary wiring and may be separated from another portion of the intermediate layer around the auxiliary wiring by the tip.

The second electrode may overlap the first electrode and the auxiliary wiring in the plan view, and a portion of the second electrode may be located on the auxiliary wiring, and may be separated from another portion of the second electrode around the auxiliary wiring by the tip.

The auxiliary layer may overlap the auxiliary wiring in the plan view, and a portion of the auxiliary layer may be located on the auxiliary wiring and may be separated from another portion of the auxiliary layer around the auxiliary wiring by the tip.

The main sub-layer may include at least one of copper (Cu), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), and molybdenum (Mo).

At least one of the upper layer and the lower layer may include at least one selected from the group consisting of indium tin oxide (ITO), titanium (Ti), Mo, and tungsten (W).

The auxiliary layer may overlap the auxiliary wiring and the opening in the plan view, and the auxiliary layer may have a width greater than a width of the auxiliary wiring and is less than a width of the opening.

The auxiliary layer may overlap the auxiliary wiring and the opening in the plan view, and the auxiliary layer and the second electrode may have the same area in the plan view beyond the opening.

The auxiliary layer may include a conductive material.

The display device may further include a lower insulating layer arranged under the auxiliary wiring, and a portion of the intermediate layer may directly contact a portion of an upper surface of the lower insulating layer through the opening of the insulating layer.

On a plane, the auxiliary wiring may include protrusions protruding in a direction intersecting an extension direction of the auxiliary wiring.

A first contact region and a second contact region are continuous along at least one of the protrusions, the second electrode and a side surface of the auxiliary wiring contact each other in the first contact region, and the auxiliary layer and the side surface of the auxiliary wiring contact each other in the second contact region.

According to one or more embodiments, a display device may include a display area and a non-display area outside the display area, a common voltage supply line arranged in the non-display area, an auxiliary wiring electrically connected to the common voltage supply line and arranged in the display area, an insulating layer arranged on the auxiliary wiring, overlapping the auxiliary wiring in a plan view and including an opening having a width greater than a width of the auxiliary wiring, a first electrode located on the insulating layer, a bank layer including an emission opening that overlaps the first electrode in the plan view, an intermediate layer overlapping the first electrode through the emission opening in the plan view and including an emission layer, a second electrode located on the intermediate layer, an auxiliary layer arranged on the second electrode. The auxiliary wiring includes sub-layers, and each of the second electrode and the auxiliary layer contacts a side surface of one of the sub-layers through the opening of the insulating layer.

The sub-layers of the auxiliary wiring may include a main sub-layer, an upper layer arranged on the main sub-layer and having a tip protruding from a part in which a side surface and an upper surface of the main sub-layer meet each other, and a lower layer arranged under the main sub-layer, and each of the second electrode and the auxiliary layer may directly contact the side surface of the main sub-layer.

The second electrode may overlap the first electrode and the auxiliary wiring in the plan view, and a portion of the second electrode may be located on the auxiliary wiring and may be separated from another portion of the second electrode around the auxiliary wiring by the tip.

The auxiliary layer may overlap the auxiliary wiring in the plan view, and a portion of the auxiliary layer may be located on the auxiliary wiring and may be separated from another portion of the auxiliary layer around the auxiliary wiring by the tip.

The auxiliary layer may overlap the auxiliary wiring and the opening in the plan view, and the auxiliary layer may have a width greater than a width of the auxiliary wiring and less than a width of the opening.

The auxiliary layer may overlap the auxiliary wiring and the opening in the plan view, and the auxiliary layer and the second electrode may have a same area in the plan view beyond the opening.

The auxiliary layer may include at least one of Ag, Mg, Al, Pt, Pd, Au, Ni, Nd, Ir, Cr, Li, Ca, Mo, indium tin oxide (ITO), gallium zinc oxide (GZO), and IZO.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
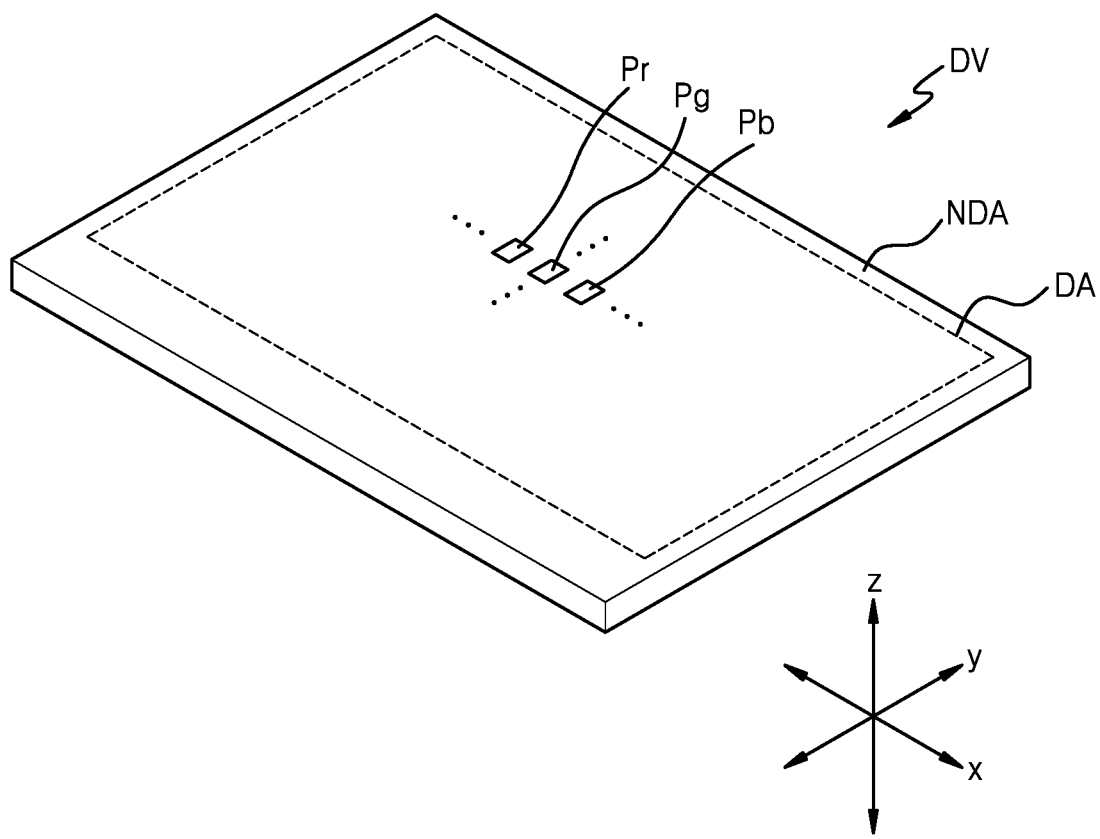
FIG. 1 is a perspective view schematically illustrating a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items.

The phrase "at least one of" is intended to include the meaning of "at least one selected from the group of" for the purpose of its meaning and interpretation. For example, "at least one of A and B" may be understood to mean "A, B, or A and B."

Since various transformations and various embodiments of the disclosure are possible, specific embodiments are illustrated in the drawings and described in detail in the detailed description. Effects and features of the disclosure, and a method of achieving them, will become apparent with reference to the embodiments described below in detail in conjunction with the drawings. However, the disclosure is not limited to the embodiments to be disclosed below and may be implemented in various forms.

Hereinafter, embodiments of the disclosure will be described in detail with reference to the accompanying drawings, and when described with reference to the drawings, the same or corresponding components are given the same reference numerals, and the repetitive description thereof will be omitted.

In the following embodiments, when various components such as layers, films, regions, plates, etc. are "on" other components, this is not only when they are "on" other components, but also when other components are interposed therebetween. In addition, in the drawings, for convenience of description, the sizes of components may be exaggerated or reduced. For example, since the size and thickness of each component shown in the drawings are arbitrarily indicated for convenience of description, the disclosure is not necessarily limited to the illustration.

In the following embodiments, the x-axis, the y-axis, and the z-axis are not limited to three axes on a Cartesian coordinate system, and may be interpreted in a broad sense including them. For example, the x-axis, y-axis, and z-axis may be orthogonal to each other, but may refer to different directions that are not orthogonal to each other.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a perspective view schematically illustrating a display device according to an embodiment.

Referring to FIG. 1, a display device DV may include a display area DA and a non-display area NDA outside the display area DA. The display device DV may provide an image in the display area DA through an array of pixels that are two-dimensionally arranged on the x-y plane. The pixels may include a first pixel, a second pixel, and a third pixel. Hereinafter, for convenience of description, a case where the first pixel is a red pixel Pr, the second pixel is a green pixel Pg, and the third pixel is a blue pixel Pb, will be described.

The red pixel Pr, the green pixel Pg, and the blue pixel Pb may be respectively areas from which red light, green light, and blue light may be emitted. The display device DV may provide an image by using light emitted from the pixels.

The non-display area NDA may be an area in which no image is provided, and may entirely surround the display area DA. A driver or a main voltage line for providing an electrical signal or power to pixel circuits may be arranged in the non-display area NDA. A pad that is an area to which an electronic device or a printed circuit board may be electrically connected, may be included in the non-display area NDA.

The display area DA may have a polygonal shape including a rectangular shape, as shown in FIG. 1. For example, the display area DA may have a rectangular shape in which a horizontal length is greater than a vertical length, a rectangular shape in which a horizontal length is less than a vertical length, or a square shape. As another example, the display area DA may have various shapes such as an elliptical shape and a circular shape.

Figure 2:
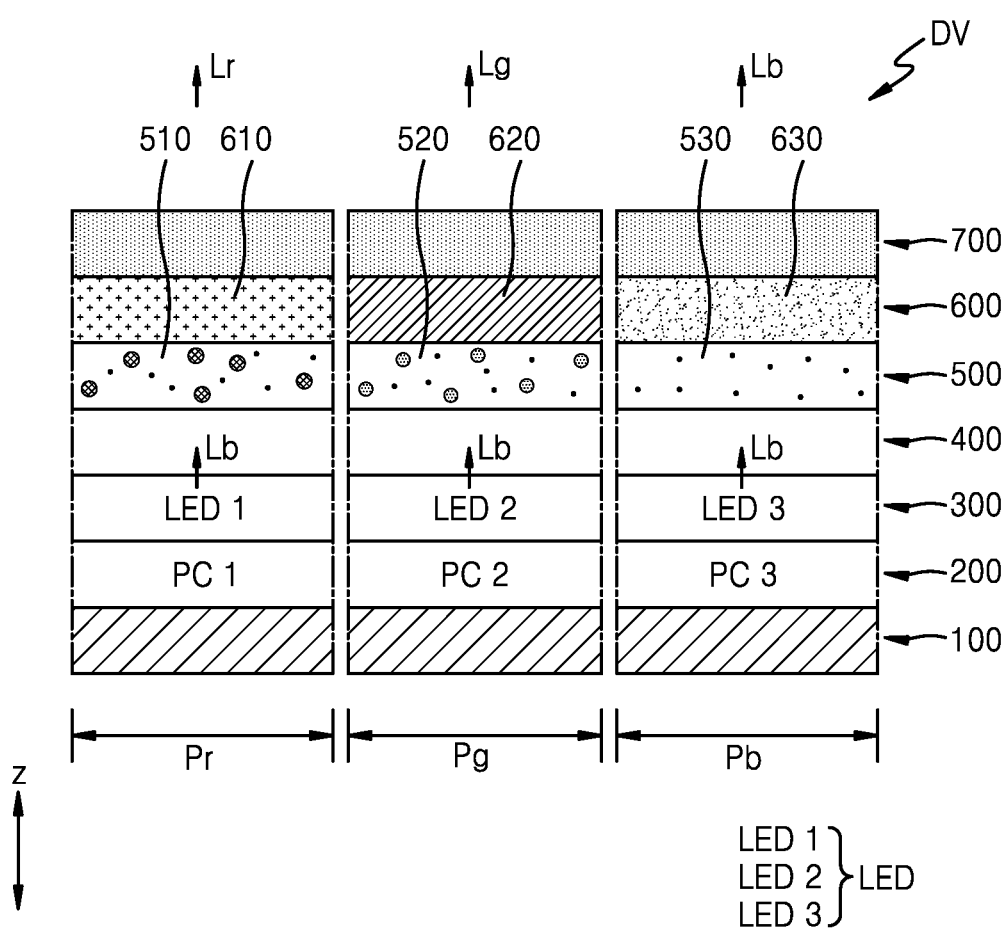
FIG. 2 is a cross-sectional view schematically illustrating pixels of a display device according to an embodiment.

FIG. 2 is a cross-sectional view schematically illustrating pixels of a display device according to an embodiment.

Referring to FIG. 2, the display device DV may include a circuit layer 200 on a substrate 100. The circuit layer 200 may include first to third pixel circuits PC1, PC2, and PC3, and the first to third pixel circuits PC1, PC2, and PC3 may be electrically and respectively connected to first to third light emitting diodes LED1, LED2, and LED3 of a light emitting diode layer 300.

The first to third light emitting diodes LED1, LED2, and LED3 may each include an organic light emitting diode including an organic material. In an embodiment, the first to third light emitting diodes LED1, LED2, and LED3 may be inorganic light emitting diodes each including an inorganic material. Each of the inorganic light emitting diodes may include a p-n junction diode including materials based on an inorganic semiconductor. In case that a voltage is applied to the p-n junction diode in a forward direction, holes and electrons may be injected, and energy generated by recombination of the holes and the electrons may be converted into light energy to emit light of a color. The inorganic light emitting diode described above may have a width of several to several hundreds of micrometers or several to several hundreds of nanometers. In some embodiments, the light emitting diode LED may be a light emitting diode including quantum dots. As described above, a light emitting layer of the light emitting diode LED may include an organic material, an inorganic material, quantum dots, an organic material and quantum dots, or an inorganic material and quantum dots.

The first to third light emitting diodes LED1, LED2, and LED3 may emit light of a same color. For example, light (e.g., blue light Lb) emitted from the first to third light emitting diodes LED1, LED2, and LED3 may pass through an encapsulation layer 400 on the light emitting diode layer 300 and may pass through a color conversion-transmitting layer 500.

The color conversion-transmitting layer 500 may include optical parts that transmit light (e.g., blue light Lb) emitted from the light emitting diode layer 300 with or without color conversion. For example, the color conversion-transmitting layer 500 may include color conversion parts that convert light (e.g., blue light Lb) emitted from the light emitting diode layer 300 into light of different colors, and a transmitting part that transmits light (e.g., blue light Lb) emitted from the light emitting diode layer 300 without color conversion. The color conversion-transmitting layer 500 may include a first color conversion part 510 corresponding to the red pixel Pr, a second color conversion part 520 corresponding to the green pixel Pg, and a transmitting part 530 corresponding to the blue pixel Pb. The first color conversion part 510 may convert the blue light Lb into red light Lr, and the second color conversion part 520 may convert the blue light Lb into green light Lg. The transmitting part 530 may pass through the blue light Lb without conversion.

A color layer 600 may be arranged on the color conversion-transmitting layer 500. The color layer 600 may include first to third color filters 610, 620, and 630 of different colors. For example, the first color filter 610 may be a red color filter, the second color filter 620 may be a green color filter, and the third color filter 630 may be a blue color filter.

Light that is color-converted and transmitted by the color conversion-transmitting layer 500 may pass through the first to third color filters 610, 620, and 630 so that color purity may be enhanced. Also, the color layer 600 may prevent or minimize external light (e.g., light incident toward the display device DV from the outside of the display device DV) from being reflected and visually recognized by a user.

A light-transmitting base layer 700 may be provided on the color layer 600. The light-transmitting base layer 700 may include glass or a light-transmitting organic material. For example, the light-transmitting base layer 700 may include a light-transmitting organic material such as acryl-based resin.

In an embodiment, the light-transmitting base layer 700 may be a kind of substrate, and after the color layer 600 and the color conversion-transmitting layer 500 are formed on the light-transmitting base layer 700, the light-transmitting base layer 700 may be integrated so that the color conversion-transmitting layer 500 faces the encapsulation layer 400.

In an embodiment, after the color conversion-transmitting layer 500 and the color layer 600 are sequentially formed on the encapsulation layer 400, the light-transmitting base layer 700 may be directly applied and cured on the color layer 600. In some embodiments, another optical film, for example, an anti-reflection (AR) film, may be arranged on the light-transmitting base layer 700.

The display device DV having the above-described structure may include an electronic device that may display a moving image or a still image, such as a television (TV), a billboard, a cinema screen, a monitor, a tablet personal computer (PC), a laptop computer, or the like.

Figure 3:
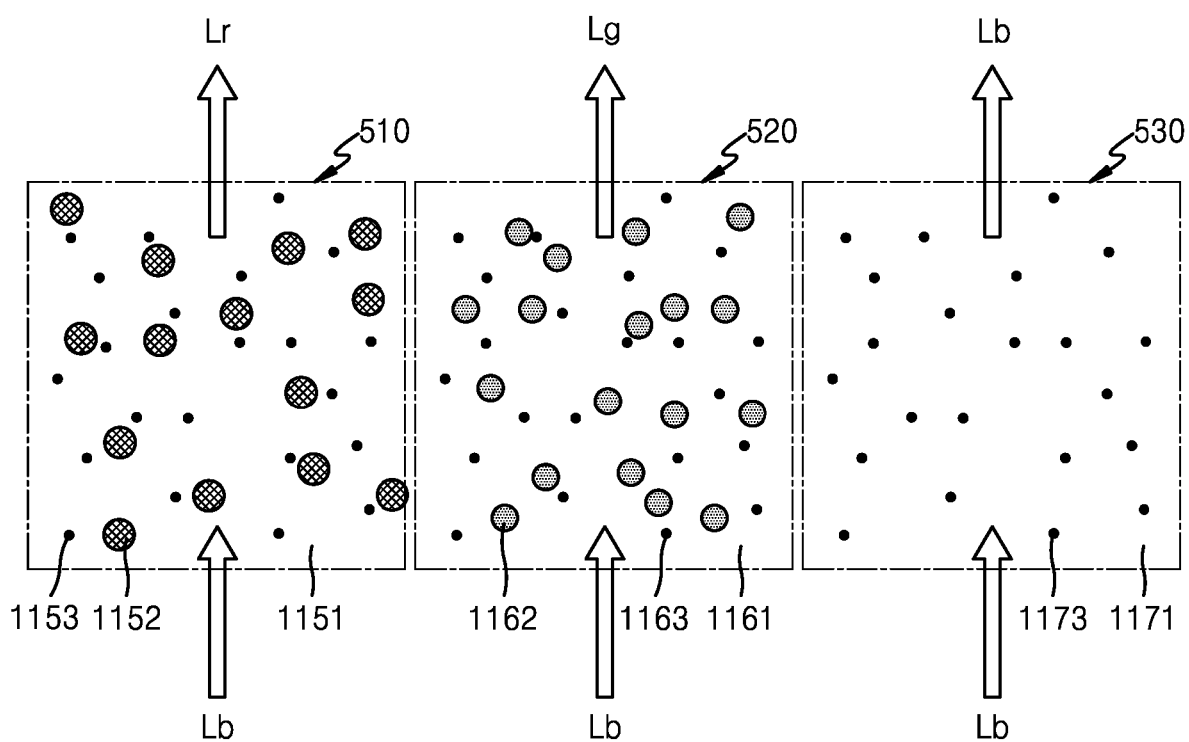
FIG. 3 schematically illustrates optical parts of a color conversion-transmitting layer of FIG. 2.

FIG. 3 illustrates optical parts of a color conversion-transmitting layer of FIG. 2.

Referring to FIG. 3, a first color conversion part 510 may convert incident blue light Lb into red light Lr. The first color conversion part 510 may include a first photosensitive polymer 1151, and first quantum dots 1152 and first scattering particles 1153 which are dispersed in the first photosensitive polymer 1151.

The first quantum dots 1152 may be excited by the blue light Lb to isotropically emit the red light Lr having a longer wavelength than the blue light Lb. The first photosensitive polymer 1151 may be an organic material having light transmittance. The first scattering particles 1153 may scatter the blue light Lb that is not absorbed on the first quantum dots 1152 so that more first quantum dots 1152 may be excited. Thus, color conversion efficiency may be increased. The first scattering particles 1153 may be, for example, titanium oxide ($TiO_2$) or metal particles. The first quantum dots 1152 may be selected from the group consisting of a group II-VI compound, a group III-V compound, a group IV-VI compound, a group-IV element, a group-IV compound, and a combination thereof.

The second color conversion part 520 may convert the incident blue light Lb into green light Lg. The second color conversion part 520 may include a second photosensitive polymer 1161, and second quantum dots 1162 and second scattering particles 1163 which are dispersed in the second photosensitive polymer 1161.

The second quantum dots 1162 may be excited by the blue light Lb to isotropically emit the green light Lg having a longer wavelength than the blue light Lb. The second photosensitive polymer 1161 may be an organic material having light transmittance.

The second scattering particles 1163 may scatter the blue light Lb that is not absorbed on the second quantum dots 1162, so that more second quantum dots 1162 may be excited. Thus, color conversion efficiency may be increased. The second scattering particles 1163 may be, for example, titanium oxide ($TiO_2$) or metal particles. The second quantum dots 1162 may be selected from the group consisting of a group II-VI compound, a group III-V compound, a group IV-VI compound, a group-IV element, a group-IV compound, and a combination thereof.

The transmitting part 530 may transmit the blue light Lb without converting the blue light Lb that is incident on the transmitting part 530. The transmitting part 530 may include a third photosensitive polymer 1171 in which third scattering particles 1173 are dispersed, as shown in FIG. 3. The third photosensitive polymer 1171 may be an organic material having light transmittance, such as silicon resin or epoxy resin, and the third photosensitive polymer 1171 and the first and second photosensitive polymers 1151 and 1161 may include a same material. The third scattering particles 1173 may scatter and emit the blue light Lb, and the third scattering particles 1173 and the first and second scattering particles 1153 and 1163 may include a same material.

Figure 4:
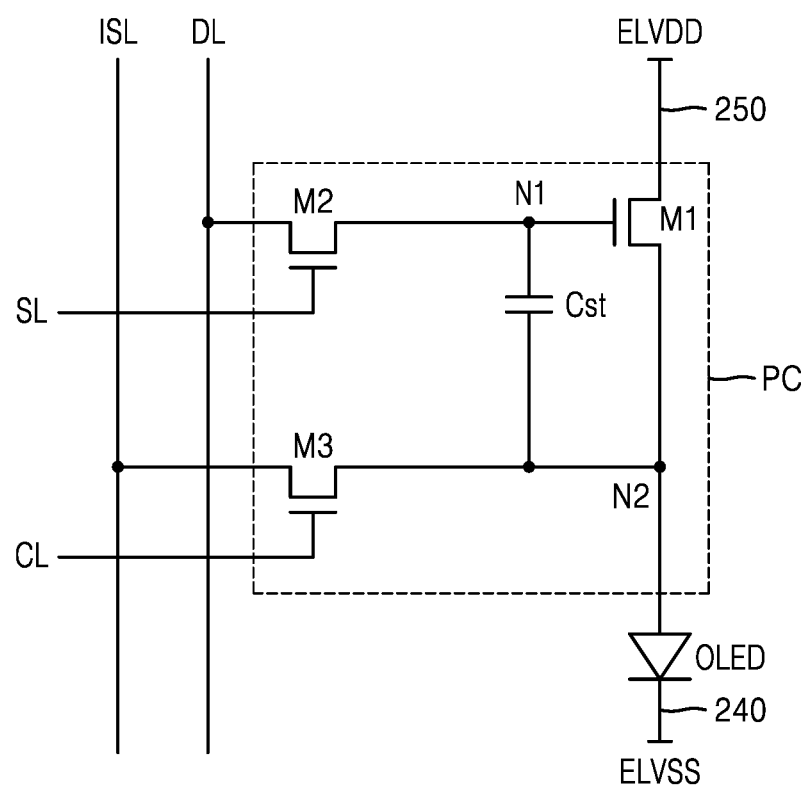
FIG. 4 is a schematic diagram of an equivalent circuit of a light emitting diode and a pixel circuit electrically connected to the light emitting diode of a display device according to an embodiment.

FIG. 4 is a schematic diagram of an equivalent circuit of a light emitting diode and a pixel circuit electrically connected to the light emitting diode of a display device according to an embodiment. A pixel circuit PC shown in FIG. 4 may correspond to each of the first to third pixel circuits PC1, PC2, and PC3, and the light emitting diode of FIG. 4 may correspond to each of the first to third light emitting diodes LED1, LED2, and LED3 described above with reference to FIG. 2.

Referring to FIG. 4, a first electrode (e.g., an anode) of a light emitting diode, for example, an organic light emitting diode OLED, may be electrically connected to the pixel circuit PC, and a second electrode (e.g., a cathode) of the organic light emitting diode OLED may be electrically connected to an auxiliary wiring 240 for providing a common voltage ELVSS. The organic light emitting diode OLED may emit light with brightness corresponding to the amount of current supplied from the pixel circuit PC.

The organic light emitting diode OLED of FIG. 4 may correspond to each of the first to third light emitting diodes LED1, LED2, and LED3 shown in FIG. 2 described above, and the pixel circuit PC of FIG. 4 may correspond to each of the first to third pixel circuits PC1, PC2, and PC3 shown in FIG. 2 described above.

The pixel circuit PC may control the amount of current that flows from a driving voltage line 250 for providing a driving voltage ELVDD to the auxiliary wiring 240 via the organic light emitting diode OLED in response to a data signal. The pixel circuit PC may include a first transistor M1, a second transistor M2, a third transistor M3, and a storage capacitor Cst.

Each of the first transistor M1, the second transistor M2, and the third transistor M3 may be an oxide semiconductor transistor including a semiconductor layer including an oxide semiconductor, or a silicon semiconductor transistor including a semiconductor layer including polysilicon. According to the type of a transistor, the first electrode may be one of a source electrode and a drain electrode, and the second electrode may be the other of the source electrode and the drain electrode.

A first electrode of the first transistor M1 may be electrically connected to a driving voltage line 250 for providing the driving voltage ELVDD, and a second electrode of the first transistor M1 may be electrically connected to the first electrode of the organic light emitting diode OLED. A gate electrode of the first transistor M1 may be electrically connected to a first node N1. The first transistor M1 may control the amount of current that flows from the driving voltage line 250 to the organic light emitting diode OLED in response to a voltage of the first node N1.

The second transistor M2 may be a switching transistor. A first electrode of the second transistor M2 may be electrically connected to a data line DL, and a second electrode of the second transistor M2 may be electrically connected to the first node N1. A gate electrode of the second transistor M2 may be electrically connected to a scan line SL. In case that a scan signal is supplied to the scan line SL, the second transistor M2 may be turned on to electrically connect the data line DL to the first node N1.

The third transistor M3 may be an initialization transistor and/or a sensing transistor. A first electrode of the third transistor M3 may be electrically connected to a second node N2, and a second electrode of the third transistor M3 may be electrically connected to a sensing line ISL. A gate electrode of the third transistor M3 may be electrically connected to a control line CL.

The storage capacitor Cst may be electrically connected between the first node N1 and the second node N2. For example, a first capacitor electrode of the storage capacitor Cst may be electrically connected to the gate electrode of the first transistor M1, and a second capacitor electrode of the storage capacitor Cst may be electrically connected to the first electrode of the organic light emitting diode OLED.

FIG. 4 illustrates that the first transistor M1, the second transistor M2, and the third transistor M3 are N-channel metal oxide semiconductor (NMOS) transistors. However, embodiments are not limited thereto. For example, at least one of the first transistor M1, the second transistor M2, and the third transistor M3 may be a P-channel metal oxide semiconductor (PMOS) transistor.

FIG. 4 illustrates three transistors. However, embodiments are not limited thereto. The pixel circuit PC may include four or more transistors.

Figure 5A:
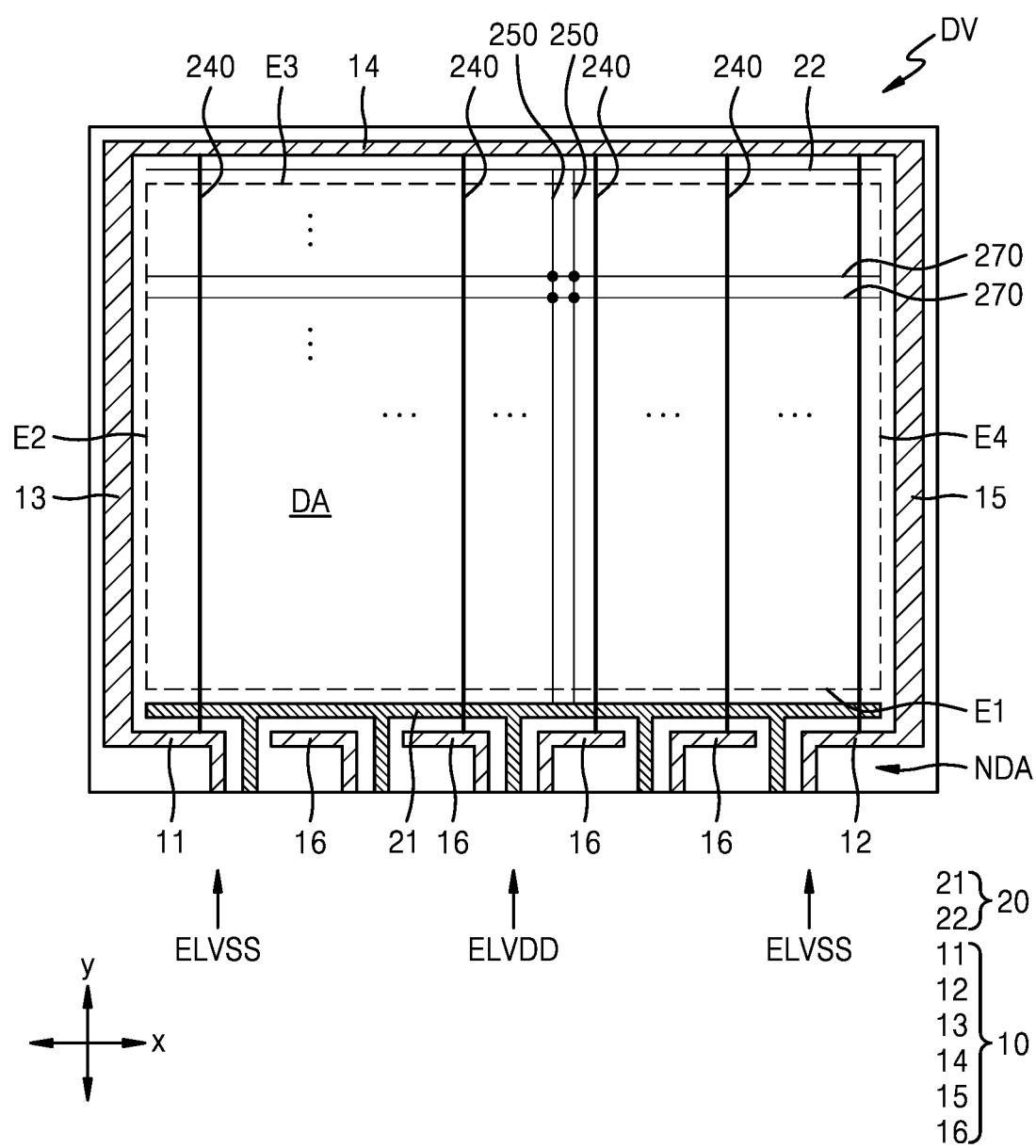
FIG. 5A is a plan view schematically illustrating a common voltage supply line and a driving voltage supply line of a display device according to an embodiment.

FIG. 5A is a schematic plan view illustrating a common voltage supply line and a driving voltage supply line of a display device according to an embodiment.

Referring to FIG. 5A, a display device DV may include a common voltage supply line 10 for supplying a common voltage ELVSS to the second electrode of the organic light emitting diode OLED described above with reference to FIG. 4, and a driving voltage supply line 20 for supplying a driving voltage ELVDD to the pixel circuit PC. The common voltage supply line 10 and the driving voltage supply line 20 may be arranged in the non-display area NDA.

The display device DV and the substrate 100 may have substantially a same shape. For example, the substrate 100 may include the display area DA and the non-display area NDA outside the display area DA. Hereinafter, for convenience of description, it will be described that the substrate 100 includes the display area DA and the non-display area NDA outside the display area DA.

The common voltage supply line 10 may include a first common voltage input part 11 and a second common voltage input part 12 which are arranged adjacent to a first edge E1 of the display area DA. The first common voltage input part 11 and the second common voltage input part 12 may be apart from each other in an x direction and may be integrally and electrically connected to each other through first to third extension portions 13, 14, and 15 which are arranged adjacent to second to fourth edges E2, E3 and E4 of the display area DA, respectively.

At least one third common voltage input part 16 may be arranged between the first common voltage input part 11 and the second common voltage input part 12. In an embodiment, FIG. 5A illustrates four third common voltage input parts 16.

The common voltage supply line 10 may be electrically connected to the auxiliary wirings 240 that pass through the display area DA. Each of the auxiliary wirings 240 may extend in a y direction, for example, as shown in FIG. 5A. At least one auxiliary wiring 240 may extend across the display area DA in the y direction and may be electrically connected to the first common voltage input part 11 and a portion of the second extension portion 14 facing the first common voltage input part 11. At least another auxiliary wiring 240 may extend across the display area DA in the y direction and may be electrically connected to the second common voltage input part 12 and a portion of the second extension portion 14 facing the second common voltage input part 12. Similarly, at least another auxiliary wiring 240 may extend across the display area DA in the y direction and may be electrically connected to the third common voltage input part 16 and a portion of the second extension portion 14 facing the third common voltage input part 16.

In case that the common voltage supply line 10 further includes the third common voltage input part 16 arranged between the first common voltage input part 11 and the second common voltage input part 12, current density may be reduced, and heat generation may be suppressed in case that current supplied through the common voltage supply line 10 is applied, compared to the case where the common voltage supply line 10 includes only the first common voltage input part 11 and the second common voltage input part 12.

The driving voltage supply line 20 may be located in the non-display area NDA and may include a driving voltage supply part 21 that is adjacent to the first edge E1 of the display area DA, and a counterpart 22 that extends along the third edge E3 of the display area DA. The driving voltage supply part 21 and the counterpart 22 may be arranged at both sides of the display area DA with the display area DA therebetween.

The driving voltage supply line 20 may be electrically connected to driving voltage lines 250 intersecting the display area DA. Each of the driving voltage lines 250 may extend in the y direction while being electrically connected to the driving voltage supply part 21. In some embodiments, the driving voltage lines 250 may be electrically connected to horizontal driving voltage lines 270 that extend in the x direction to intersect the driving voltage lines 250. The driving voltage lines 250 and the horizontal driving voltage lines 270 may be arranged on different layers and may be electrically connected to each other via a contact hole passing through at least one insulating layer therebetween.

Figure 5B:
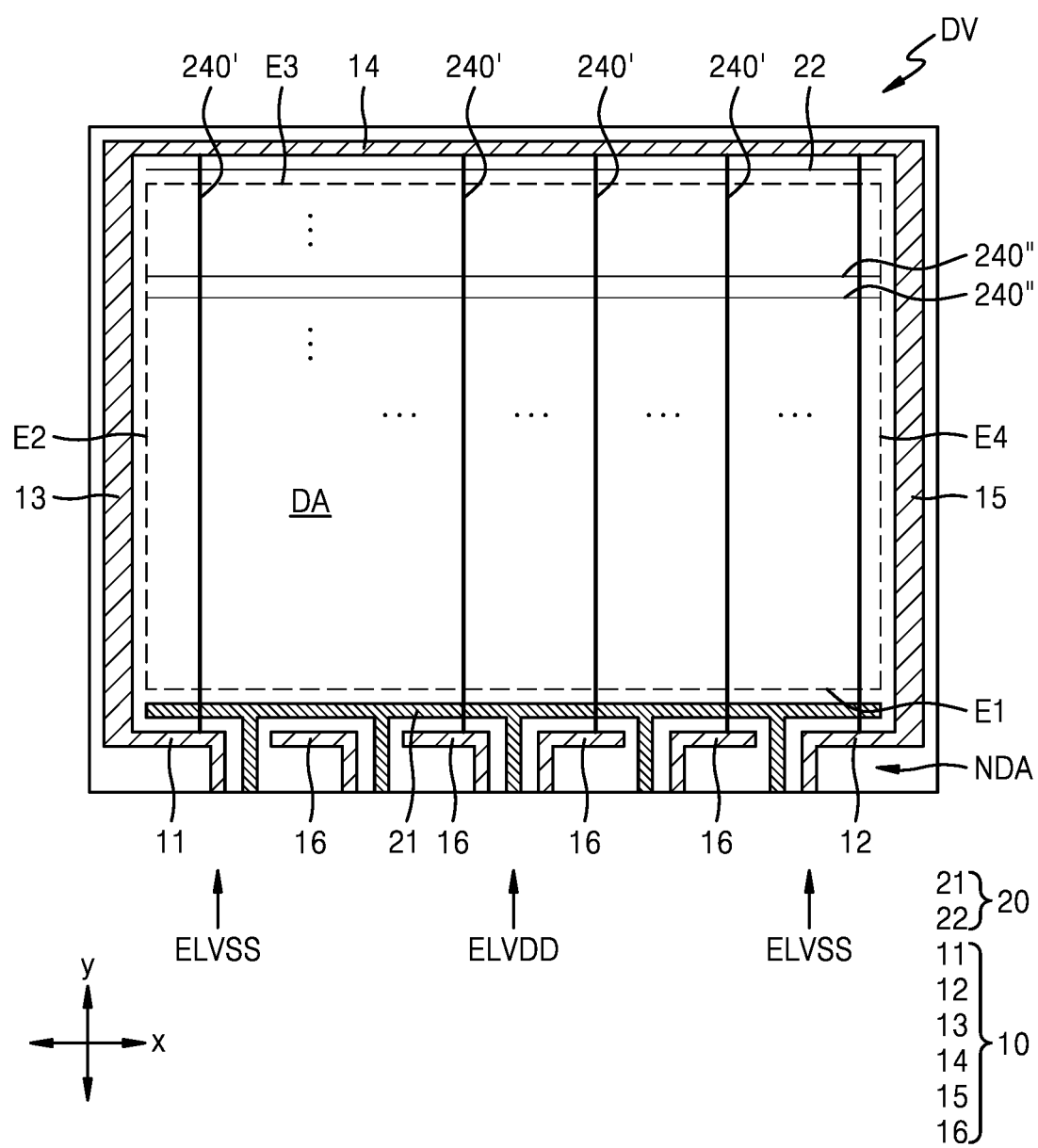
FIGS. 5B and 5C are plan views schematically illustrating a common voltage supply line of a display device according to another embodiment.
Figure 5C:
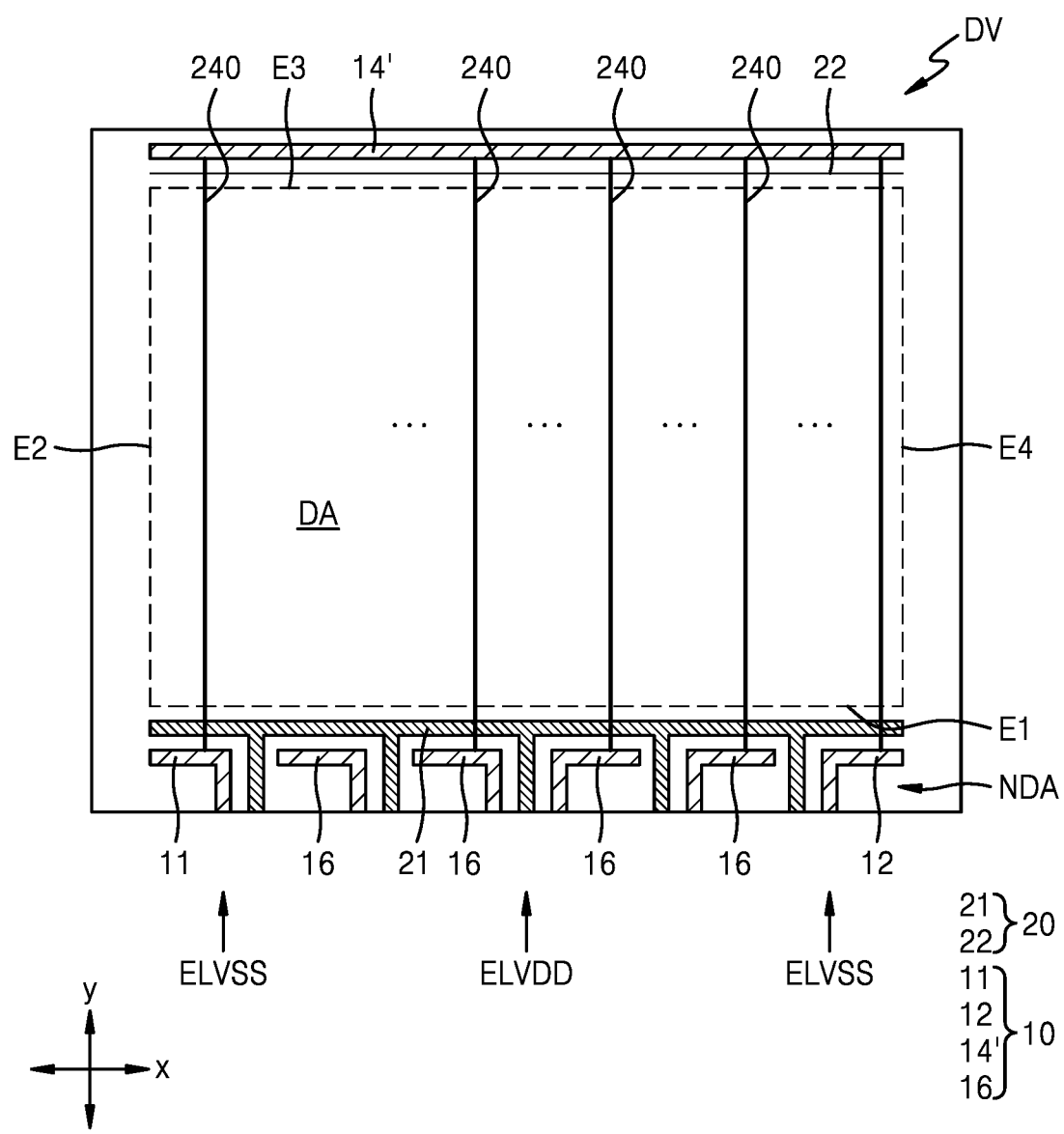

FIGS. 5B and 5C are schematic plan views illustrating a common voltage supply line of a display device according to other embodiments, respectively. The display device DV shown in FIGS. 5B and 5C may include the driving voltage line 250 (see FIG. 5A) and the horizontal driving voltage line 270 (see FIG. 5A) that are electrically connected to the driving voltage supply line 20, as described above with reference to FIG. 5A. However, for convenience of description, the driving voltage line 250 (see FIG. 5A) and the horizontal driving voltage line 270 (see FIG. 5A) are omitted from FIGS. 5B and 5C.

Referring to FIG. 5B, the display device DV may include an auxiliary wiring 240' (hereinafter referred to as a first auxiliary wiring) intersecting the display area DA in the y direction and an auxiliary wiring 240" (hereinafter referred to as a second auxiliary wiring) intersecting the display area DA in the x direction. The first auxiliary wiring 240' and the second auxiliary wiring 240" that intersect each other may be arranged on different layers and may be electrically connected to each other via a through hole formed in at least one insulating layer therebetween.

FIGS. 5A and 5B illustrate that the first common voltage input part 11 and the second common voltage input part 12 of the common voltage supply line 10 are integrally and electrically connected to each other by the first to third extension portions 13, 14, and 15. However, embodiments are not limited thereto.

In an embodiment, as shown in FIG. 5C, the common voltage supply line 10 may include a first common voltage input part 11 and a second common voltage input part 12 which are arranged adjacent to the first edge E1 of the display area DA, and an extension portion 14' that is arranged adjacent to the third edge E3 of the display area DA. The extension portion 14' may be physically separated from the first common voltage input part 11 and the second common voltage input part 12.

One end (or first end) of each of the auxiliary wirings 240 may be electrically connected to the first to third common voltage input parts 11, 12, or 16, and the other end (or second end) of each of the auxiliary wirings 240 may be electrically connected to the extension portion 14'. In other words, because the first to third common voltage input parts 11, 12, and 16 and the extension portion 14' are electrically connected to each other by the auxiliary wirings 240 intersecting the display area DA, the first extension portion 13 and the third extension portion 15 may be omitted, as shown in FIGS. 5A and 5B as described above. The first extension portion 13 and the third extension portion 15 are omitted so that a portion (e.g., a portion of the non-display area NDA adjacent to the second edge E2 and the fourth edge E4 of the display area DA) of the non-display area NDA may be reduced.

Figure 6:
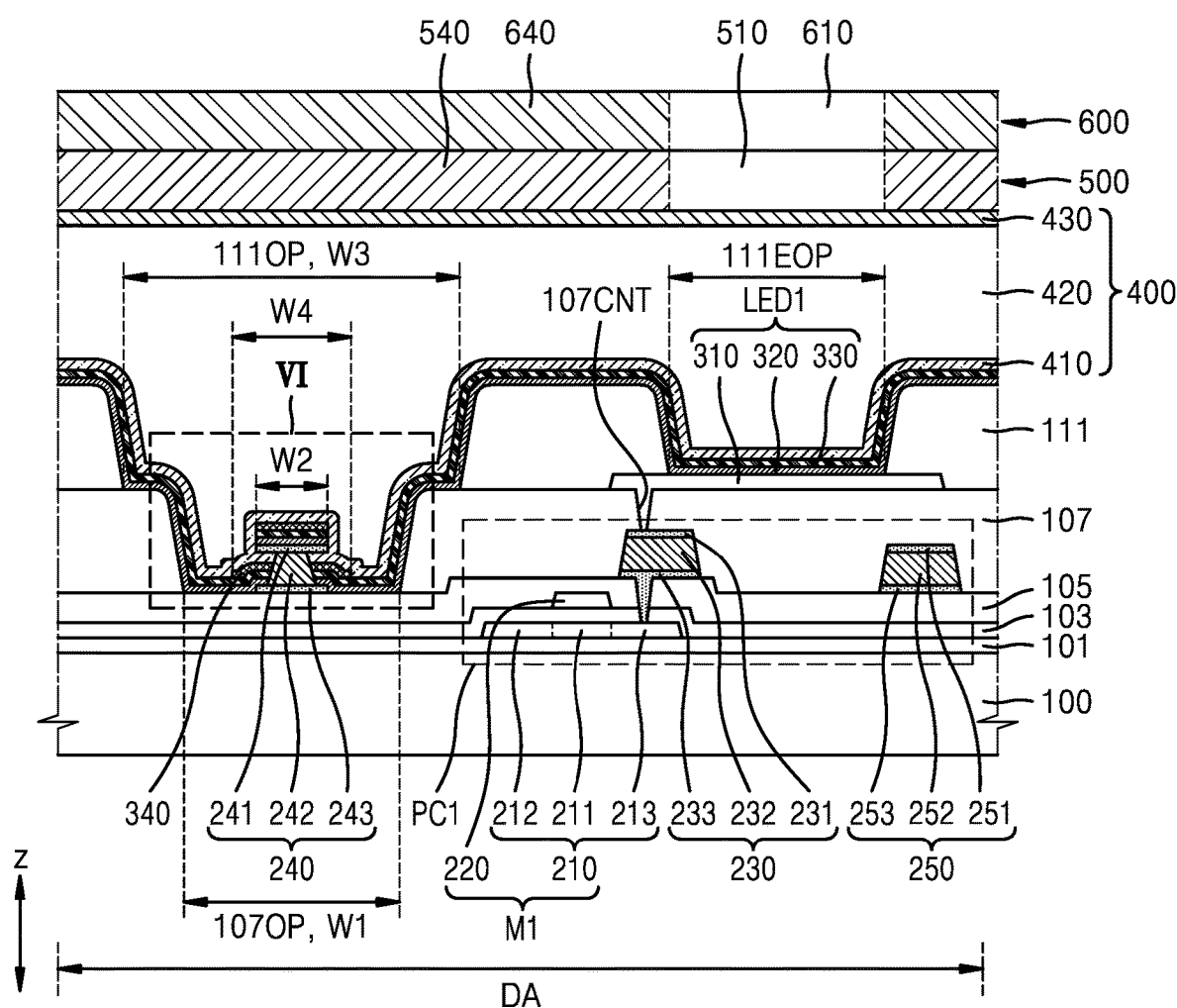
FIG. 6 is a cross-sectional view schematically illustrating a portion of a display device according to an embodiment.
Figure 7:
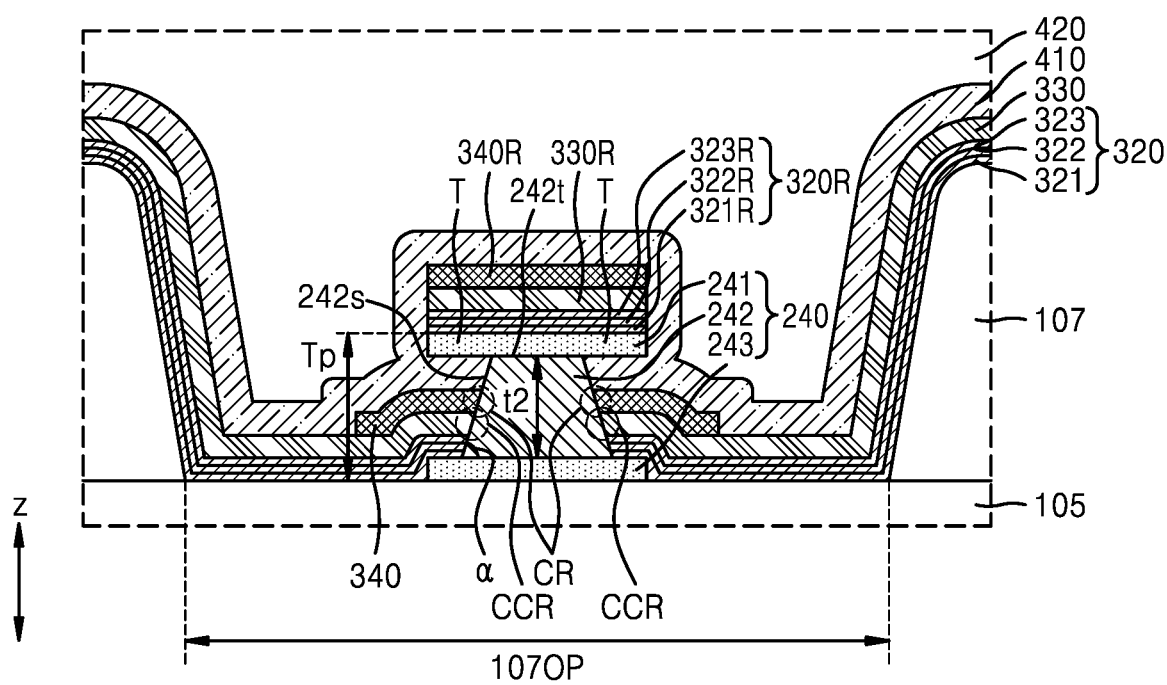
FIG. 7 is a schematic enlarged cross-sectional view of region VI of FIG. 6.
Figure 8:
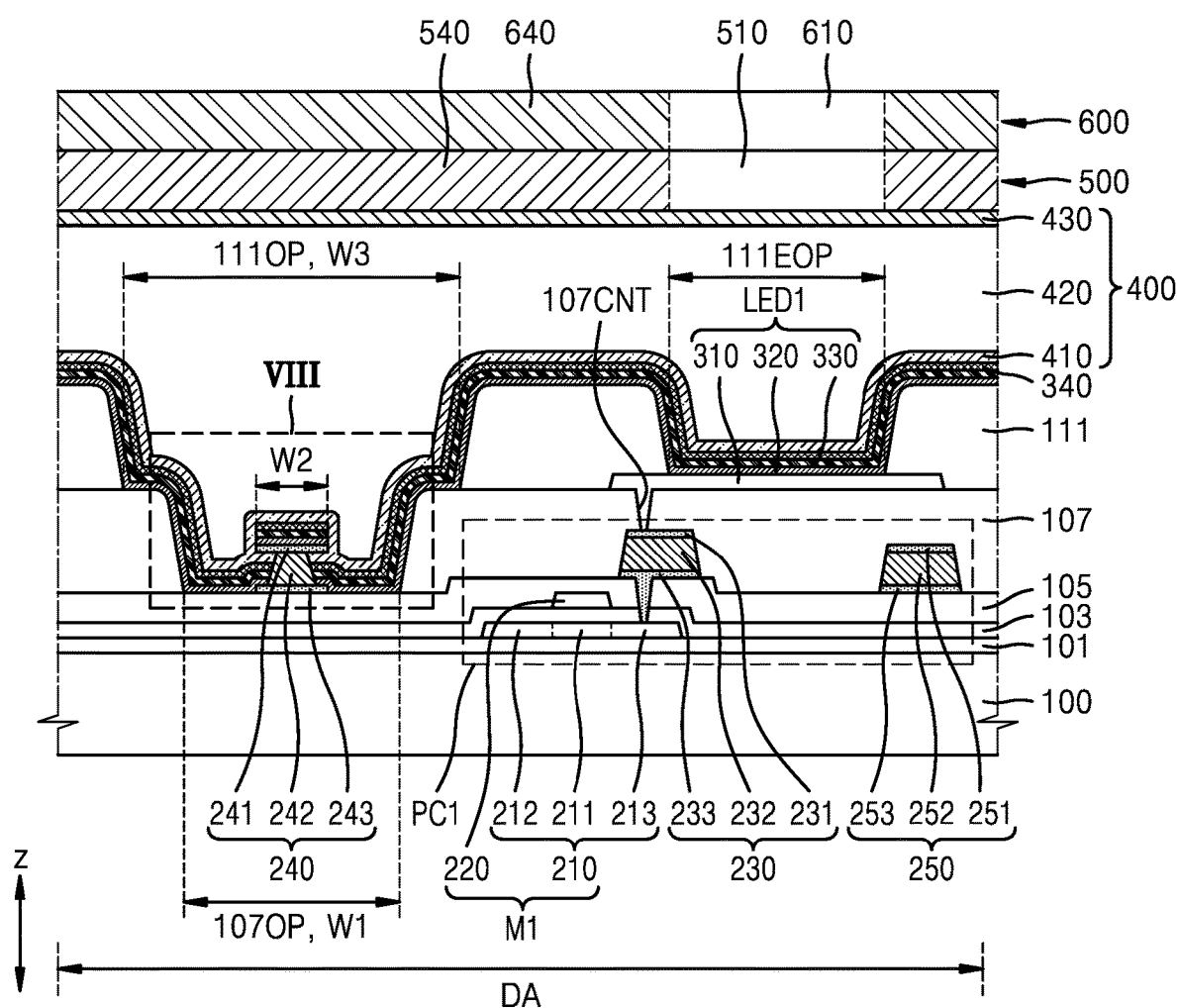
FIG. 8 is a schematic cross-sectional view illustrating a portion of a display device according to another embodiment.
Figure 9:
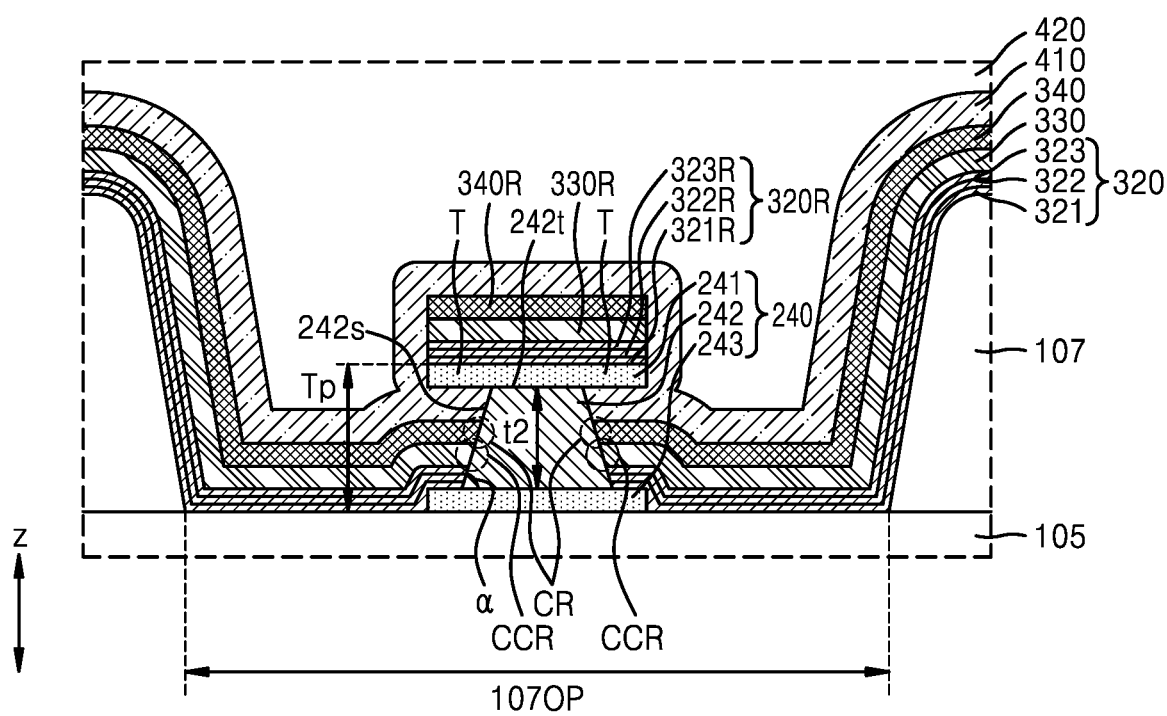
FIG. 9 is a schematic enlarged cross-sectional view of region VIII of FIG. 8.

FIG. 6 is a schematic cross-sectional view illustrating a portion of a display device according to an embodiment, and FIG. 7 is a schematic enlarged cross-sectional view of region VI of FIG. 6. FIG. 8 is a schematic cross-sectional view illustrating a portion of a display device according to an embodiment, and FIG. 9 is a schematic enlarged cross-sectional view of region VIII of FIG. 8.

Figure 10A:
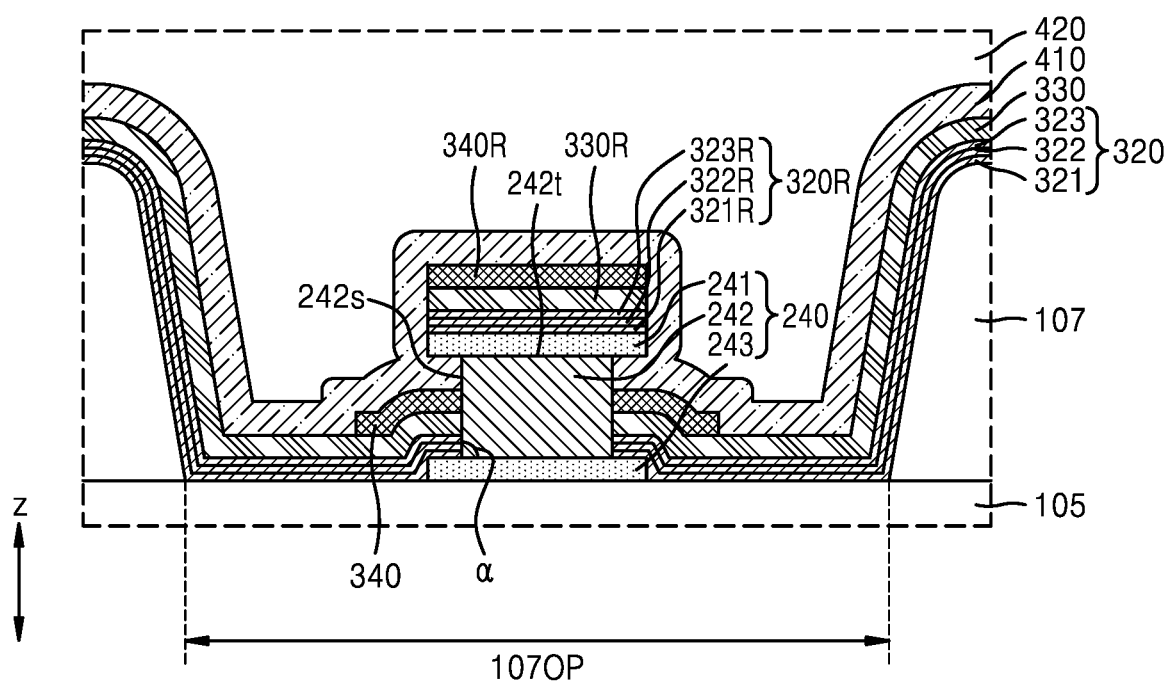
FIGS. 10A and 10B are cross-sectional views schematically illustrating an auxiliary wiring according to other embodiments, respectively.
Figure 10B:
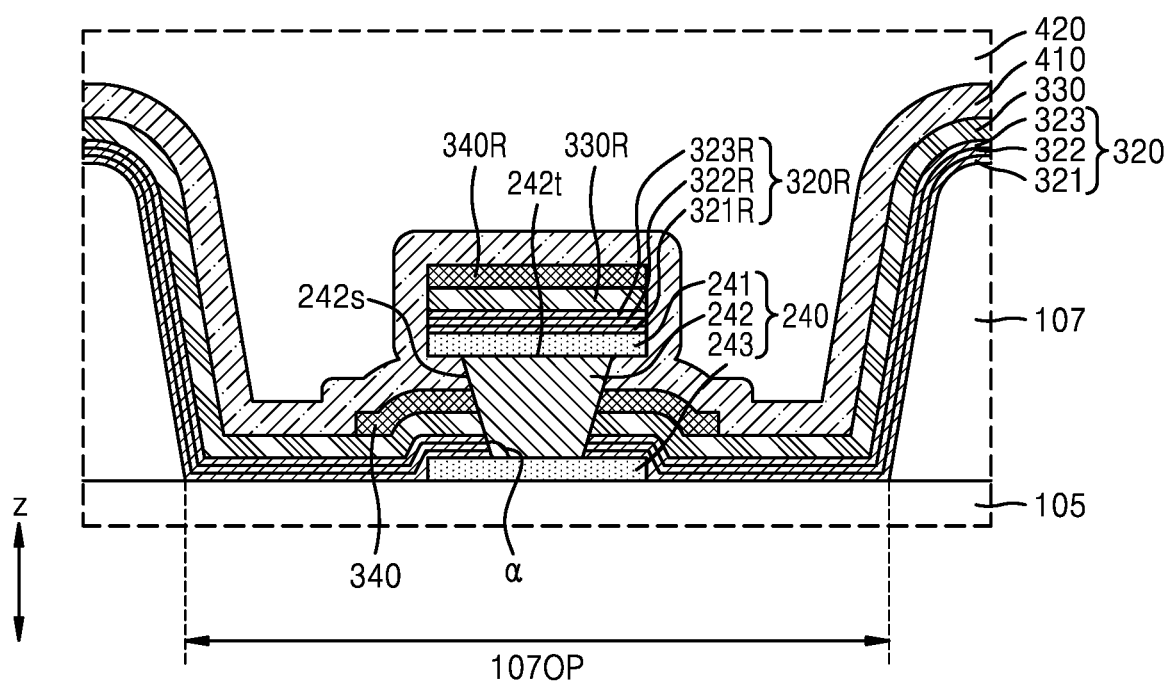

FIGS. 10A and 10B are schematic cross-sectional views illustrating an auxiliary wiring according to other embodiments, respectively.

Referring to FIG. 6, at least one of the auxiliary wirings 240, 240', and 240" described above with reference to FIGS. 5A to 5C may be electrically connected to the second electrode of the light emitting diode LED in the display area DA. Hereinafter, for convenience of description, the auxiliary wiring 240 shown in FIG. 5A or 5C is electrically connected to the second electrode of the light emitting diode LED. However, the first auxiliary wiring 240' and/or the second auxiliary wiring 240" described with reference to FIG. 5B may be electrically connected to the second electrode of the light emitting diode LED. In other words, the auxiliary wiring 240 shown in FIG. 6 may be the first auxiliary wiring 240' and/or the second auxiliary wiring 240" described with reference to FIG. 5B.

FIG. 6 illustrates a first light emitting diode LED1 among light emitting diodes arranged in a display device. However, the second and third light emitting diodes LED2 and LED3 (see FIG. 2) described above with reference to FIG. 2 and the first light emitting diode LED1 of FIG. 6 have a same structure.

Referring to FIG. 6, the first light emitting diode LED1 may be arranged on the substrate 100. A first pixel circuit PC1 electrically connected to the first light emitting diode LED1 may be arranged between the substrate 100 and the first light emitting diode LED1. The first pixel circuit PC1 may include transistors and a storage capacitor, as described above with reference to FIG. 4. In this regard, FIG. 6 illustrates a first transistor M1.

The substrate 100 may include a glass material or polymer resin. The substrate 100 including polymer resin may be flexible. For example, the shape of the display device including the substrate 100 that is flexible may be changed to be curved, bendable, rollable, or foldable.

A buffer layer 101 may be arranged on the substrate 100 and may prevent impurities from penetrating from the substrate 100 into a transistor, for example, the first transistor M1. The buffer layer 101 may include an inorganic insulating material such as silicon oxide, silicon nitride, and/or silicon oxynitride.

A driving semiconductor layer 210 of the first transistor M1 may be arranged on the buffer layer 101. The driving semiconductor layer 210 may include an oxide semiconductor. The oxide semiconductor may include indium gallium zinc oxide (IGZO), zinc tin oxide (ZTO), indium zinc oxide (IZO), or the like. In an embodiment, the driving semiconductor layer 210 may include polysilicon, amorphous silicon, an organic semiconductor, or the like. The driving semiconductor layer 210 may include a channel region 211 that overlaps a driving gate electrode 220, and a first region 212 and a second region 213 which are disposed at both sides of the channel region 211 and doped or conducted with impurities. One of the first region 212 and the second region 213 may correspond to a source region, and the other one thereof may correspond to a drain region.

The driving gate electrode 220 may overlap the channel region 211 of the driving semiconductor layer 210 with a gate insulating layer 103 therebetween. The driving gate electrode 220 may include a conductive material including molybdenum (Mo), aluminum (Al), copper (Cu), titanium (Ti), or the like, and may have a single-layered or multi-layered structure including the above-described materials. The gate insulating layer 103 may include an inorganic insulating material such as silicon oxide, silicon nitride, and/or silicon oxynitride.

An electrode 230 may be arranged on an interlayer insulating layer 105 and may be electrically connected to one of the first region 212 and the second region 213 of the driving semiconductor layer 210. In this regard, FIG. 6 illustrates that the electrode 230 is electrically connected to the second region 213. In case that the second region 213 is a source (or drain) region, the electrode 230 may correspond to a source (or drain) electrode. The interlayer insulating layer 105 may include an inorganic insulating material such as silicon oxide, silicon nitride, and/or silicon oxynitride.

The driving voltage line 250 may be arranged on the interlayer insulating layer 105, and the driving voltage line 250 and the electrode 230 may be formed together by a same process. The electrode 230 and the driving voltage line 250 may include sub-layers. For example, the electrode 230 may include a first layer 231, a second layer 232 under the first layer 231, and a third layer 233 under the second layer 232. Similarly, the driving voltage line 250 may include a first layer 251, a second layer 252 under the first layer 251, and a third layer 253 under the second layer 252.

The auxiliary wiring 240 arranged in the display area DA may be arranged adjacent to the first pixel circuit PC1. The auxiliary wiring 240, and the electrode 230 and/or the driving voltage line 250 may be arranged on a same layer. In this regard, FIG. 6 illustrates that the auxiliary wiring 240 is arranged on the interlayer insulating layer 105.

The auxiliary wiring 240 may have a stack structure including conductive layers. The auxiliary wiring 240 may include a main sub-layer 242, an upper layer 241 on the main sub-layer 242, and a lower layer 243 under the main sub-layer 242.

Referring to FIGS. 6 and 7, the main sub-layer 242 may be a sub-layer that occupies most of the auxiliary wiring 240. The fact that the main sub-layer 242 occupies most of the auxiliary wiring 240 may indicate that a thickness t2 of the main sub-layer 242 is about 50% of a total thickness Tp of the auxiliary wiring 240. In some embodiments, the thickness t2 of the main sub-layer 242 may be about 60% or more or about 70% or more of the total thickness Tp of the auxiliary wiring 240. The thickness t2 of the main sub-layer 242 may be greater than the thickness of each of the upper layer 241 and the lower layer 243. In an embodiment, the thickness t2 of the main sub-layer 242 may be about 1000 Å to about 15000 Å.

The main sub-layer 242 may include Cu, Al, platinum (Pt), palladium (Pd), silver (Ag), magnesium (Mg), gold (Au), nickel (Ni), neodymium (Nd), iridium (Ir), chromium (Cr), lithium (Li), calcium (Ca), and/or Mo. The main sub-layer 242 may have a single-layered or multi-layered structure including the above-described materials. In some embodiments, the main sub-layer 242 may be a single layer including Cu or a single layer including Al.

The lower layer 243 may include a different material from the main sub-layer 242. The lower layer 243 may be selected considering conductivity and adhesion. For example, the lower layer 243 may include a metal layer including metal such as titanium (Ti) or transparent conductive oxide (TCO) such as gallium zinc oxide (GZO) and/or IZO, and the TCO described above may be an amorphous or crystalline material.

The upper layer 241 may be arranged on the main sub-layer 242 and may include a different material from the main sub-layer 242. The upper layer 241 may prevent the main sub-layer 242 from being damaged during a process of manufacturing the display device. The upper layer 241 may include TCO such as ITO. The upper layer 241 may include metal such as Ti, Mo, and/or tungsten (W). As another example, the upper layer 241 may have a multi-layered structure including the above-described metal layer and a TCO layer.

The electrode 230 and the driving voltage line 250 arranged on the same layer as the auxiliary wiring 240, and the auxiliary wiring 240 may include a same material. For example, the first layer 231, the second layer 232, and the third layer 233 of the electrode 230 and the upper layer 241, the main sub-layer 242, and the lower layer 243 of the auxiliary wiring 240 may include a same material, respectively. Similarly, the first layer 251, the second layer 252, and the third layer 253 of the driving voltage line 250 and the upper layer 241, the main sub-layer 242, and the lower layer 243 of the auxiliary wiring 240 may include a same material, respectively.

A planarization insulating layer 107 may be arranged on the electrode 230, the auxiliary wiring 240, and the driving voltage line 250. The planarization insulating layer 107 may include an organic insulating material such as acryl, benzocyclobutene (BCB), polyimide, and/or hexamethyldisiloxane (HMDSO).

The planarization insulating layer 107 may include a first opening 1070P that overlaps the auxiliary wiring 240. A first width W1 of the first opening 1070P may be greater than a second width W2 of the auxiliary wiring 240. Thus, a portion of an upper surface of an insulating layer, for example, the interlayer insulating layer 105 under the planarization insulating layer 107, may be exposed through the first opening 1070P.

A first electrode 310 on the planarization insulating layer 107 may be electrically connected to the first pixel circuit PC1 through a contact hole 107 CNT. For example, as shown in FIG. 6, the first electrode 310 may be electrically connected to the electrode 230 through the contact hole 107 CNT.

The first electrode 310 may include TCO such as ITO, IZO, ZnO, $In_2O_3$, IGO or AZO. In an embodiment, the first electrode 310 may include a reflective layer including Ag, Mg, Al, Pt, Pd, Au, Ni, Nd, Ir, Cr, or a compound thereof. In an embodiment, the first electrode 310 may further include a layer formed of ITO, IZO or $In_2O_3$ on/under the above-described reflective layer. For example, the first electrode 310 may have a three-layer structure in which an ITO layer, an Ag layer and an ITO layer are stacked.

A bank layer 111 may be arranged on the first electrode 310 and may cover (or overlap in a plan view) edges of the first electrode 310. The bank layer 111 may include an opening (hereinafter referred to as an emission opening 111EOP) that overlaps a portion of the first electrode 310. A central portion of the first electrode 310 may be exposed through the emission opening 111EOP. The bank layer 111 may include an organic material. The bank layer 111 may include a second opening 111OP that overlaps the first opening 1070P of the planarization insulating layer 107. A third width W3 of the second opening 111OP may be greater than the first width W1 of the first opening 1070P.

An intermediate layer 320 may contact (or be in contact with) the first electrode 310 through the emission opening 111EOP. The intermediate layer 320 may include an emission layer 322, as shown in FIG. 7, and may include a functional layer located under and/or on the emission layer 322. In this regard, FIG. 7 illustrates that the intermediate layer 320 includes a first functional layer 321 under the emission layer 322 and a second functional layer 323 on the emission layer 322.

The first functional layer 321 may have a single or multi-layered structure. The first functional layer 321 may include a hole injection layer (HIL) and/or a hole transport layer (HTL). The emission layer 322 may include a polymer or small (or high or low) molecular weight organic material that emits light of a color. The second functional layer 323 may include an electron transport layer (ETL) and/or an electron injection layer (EIL).

A second electrode 330 may include a conductive material having a low work function. For example, the second electrode 330 may include a (semi-)transparent layer including Ag, Mg, Al, Pt, Pd, Au, Ni, Nd, Ir, Cr, Li, Ca, or an alloy thereof. As another example, the second electrode 330 may further include a layer such as ITO, IZO, ZnO, or $In_2O_3$ on the (semi-)transparent layer including the above-described materials.

Unlike the first electrode 310, the intermediate layer 320 and the second electrode 330 may be deposited by using a mask having an opening corresponding to the display area DA. Thus, the intermediate layer 320 may have the same area as the total area of the display area DA in a plan view and may be electrically disconnected or separated from the auxiliary wiring 240 by the shape of the auxiliary wiring 240. Similarly, the second electrode 330 may have the same area as the total area of the display area DA in the plan view and may be electrically disconnected or separated from the auxiliary wiring 240 by the shape of the auxiliary wiring 240. Portions of the second electrode 330 located outside the auxiliary wiring 240 may contact a side surface of the auxiliary wiring 240. Similarly, portions of the intermediate layer 320 located outside the auxiliary wiring 240 may contact the side surface of the auxiliary wiring 240.

An auxiliary layer 340 may include a conductive material. For example, the auxiliary layer 340 may include Ag, Mg, Al, Pt, Pd, Au, Ni, Nd, Ir, Cr, Li, Ca, or Mo. Also, the auxiliary layer 340 may include conductive oxide. For example, the auxiliary layer 340 may include TCO such as ITO, GZO, and/or IZO, and the above-described TCO may be an amorphous or crystalline material. The auxiliary layer 340 may have a single-layered or multi-layered structure including the above-described materials. For example, the auxiliary layer 340 may have a composite structure in which a metal layer and a conductive oxide layer are stacked.

The auxiliary layer 340 may be a layer having conductivity and may be arranged on the second electrode 330. In an embodiment, as shown in FIGS. 6 and 7, the auxiliary layer 340 may be deposited by using a mask having an opening corresponding to a region in which the auxiliary wiring 240 and the first opening 1070P of the display area DA are formed. In this case, a fourth width W4 of the auxiliary layer 340 may be greater than the second width W2 of the auxiliary wiring 240 and may be less than the first width W1 of the first opening 1070P.

In an embodiment, as shown in FIGS. 8 and 9, the auxiliary layer 340 may be deposited by using a mask having an opening corresponding to the display area DA. Thus, the auxiliary layer 340 may have the same area as the total area of the display area DA in the plan view beyond the region in which the first opening 1070P is formed. In an embodiment, the auxiliary layer 340 may overlap the auxiliary wiring 240 and the first opening 1070P, and the auxiliary layer 340 and the second electrode 330 may have a same area in the plan view beyond the first opening 1070P.

The auxiliary layer 340 may be electrically disconnected or separated from the auxiliary wiring 240. Portions of the auxiliary layer 340 located outside the auxiliary wiring 240 may contact the side surface of the auxiliary wiring 240. The auxiliary layer 340 may be a conductive layer, and may be directly arranged on an upper surface of the second electrode 330 and may contact the side surface of the auxiliary wiring 240 so that a contact resistance between the second electrode 330 and the auxiliary wiring 240 may be reduced. Also, the contact resistance between the second electrode 330 and the auxiliary wiring 240 may be reduced by using the auxiliary layer 340 so that the thickness of the second electrode 330 may be maintained to be thin.

The auxiliary wiring 240 may be formed so that the width of the upper layer 241 on the main sub-layer 242 may be greater than the width of an upper surface 242t of the main sub-layer 242, as shown in FIG. 7. In other words, in a cross-sectional view, the upper layer 241 may include a tip T protruding from a point where a side surface 242s and an upper surface 242t of the main sub-layer 242 meet each other. Such a structure may be formed in a process of etching a portion of the auxiliary wiring 240 exposed through the first opening 1070P, for example, in an etching process using an etchant in a process of forming the first electrode 310.

A material of the main sub-layer 242 may include a material having a different etching selectivity from a material of the upper layer 241. Similarly, a material of the lower layer 243 may include a material having a different etching selectivity from the material of the main sub-layer 242. In some embodiments, the lower layer 243 and the upper layer 241 may include a same material. The main sub-layer 242 is overetched compared to the upper layer 241 by the etchant used in the etching process, so that a structure having the tip T, as shown in FIGS. 6 and 7, may be formed.

As previously described, the auxiliary wiring 240 comprises the structure having the tip. And, the intermediate layer 320, the second electrode 330, and the auxiliary layer 340 may be deposited on the auxiliary wiring 240 in a direction (z direction) perpendicular to the substrate 100 and an oblique direction thereto. Thus, the intermediate layer 320, the second electrode 330, and the auxiliary layer 340 may be electrically disconnected by the tip structure of the auxiliary wiring 240.

A portion 320R of the intermediate layer 320 may be located on an upper surface of the auxiliary wiring 240, and the other portion of the intermediate layer 320 adjacent to the auxiliary wiring 240 may directly contact a side surface 242s of the main sub-layer 242. A portion 330R of the second electrode 330 may be located on an upper surface of the intermediate layer 320 located on the upper surface of the auxiliary wiring 240, and the other portion of the second electrode 330 adjacent to the auxiliary wiring 240 may directly contact the side surface 242s of the main sub-layer 242 to form a first contact region CCR. Also, a portion 340R of the auxiliary layer 340 may be located on an upper surface of the second electrode 330, located on the upper surface of the auxiliary wiring 240, and the other portion of the auxiliary layer 340 adjacent to the auxiliary wiring 240 may directly contact the side surface 242s of the main sub-layer 242 to form a second contact region CR.

In some embodiments, in case that the intermediate layer 320 includes the first functional layer 321, the emission layer 322, and the second functional layer 323, as shown in FIG. 7, each of the first functional layer 321, the emission layer 322, and the second functional layer 323 may be electrically disconnected from the auxiliary wiring 240. Thus, each of the first functional layer 321, the emission layer 322, and the second functional layer 323 may include a portion outside the auxiliary wiring 240, and portions 321R, 322R, and 323R located on the upper surface of the auxiliary wiring 240.

As illustrated in FIG. 7, an inclination angle α of the side surface 242s of the main sub-layer 242 may be greater than or equal to about 20° and less than about 90°. FIGS. 6 and 7 illustrate that the side surface 242s of the main sub-layer 242 has a tapered shape in a forward direction. However, embodiments are not limited thereto. In an embodiment, as shown in FIG. 10A, the inclination angle α of the side surface 242s of the main sub-layer 242 may be about 90°. As another example, as shown in FIG. 10B, the inclination angle α of the side surface 242s of the main sub-layer 242 may be greater than about 90° and less than or equal to about 135°.

Referring back to FIG. 6, a light emitting diode including a multi-layered structure of the first electrode 310, the intermediate layer 320, and the second electrode 330, for example, a first light emitting diode LED1 may be covered by the encapsulation layer 400. The encapsulation layer 400 may include at least one inorganic encapsulation layer and at least one organic encapsulation layer. In an embodiment, the encapsulation layer 400 may include a first inorganic encapsulation layer 410, an organic encapsulation layer 420, and a second inorganic encapsulation layer 430 which are sequentially stacked.

Each of the first and second inorganic encapsulation layers 410 and 430 may include one or more inorganic insulating materials. The inorganic insulating materials may include aluminum oxide, tantalum oxide, hafnium oxide, zinc oxide, silicon oxide, silicon nitride, and/or silicon oxynitride. The first and second inorganic encapsulation layers 410 and 430 may be formed by chemical vapor deposition. Because the first inorganic encapsulation layer 410 has a relatively high step coverage, although the auxiliary wiring 240 has the tip T (see FIG. 7), the auxiliary wiring 240 may be entirely covered. For example, the first inorganic encapsulation layer 410 may consecutively extend to cover the portions of the intermediate layer 320, the second electrode 330, and the auxiliary layer 340 disposed outside the auxiliary wiring 240, a portion of the side surface 242s of the main sub-layer 242, a lower surface and a side surface of the upper layer 241, a portion 320R of the intermediate layer 320, a portion 330R of the second electrode 330, and a portion 340R of the auxiliary layer 340 on the auxiliary wiring 240.

The organic encapsulation layer 420 may include a polymer-based material. The polymer-based material may include acryl-based resin, epoxy-based resin, polyimide, polyethylene, and the like. The acryl-based resin may include, for example, polymethylmethacrylate, polyacrylic acid, or the like.

The color-conversion transmitting layer 500 and the color layer 600 may be arranged on the encapsulation layer 400. In this regard, FIG. 6 illustrates that the first color conversion part 510 of the color conversion-transmitting layer 500 is disposed to overlap the first light emitting diode LED1 and the first color filter 610 of the color layer 600 is disposed to overlap the first light emitting diode LED1. Each of the first color conversion part 510 and the first color filter 610 may be surrounded by light shielding parts 540 and 640. In this regard, FIG. 6 illustrates the light shielding parts 540 and 640 arranged at both sides of each of the first color conversion part 510 and the first color filter 610. The light shielding parts 540 and 640 may include a light shielding material such as a black matrix, and the auxiliary wiring 240 may overlap the light shielding parts 540 and 640.

Figure 11A:
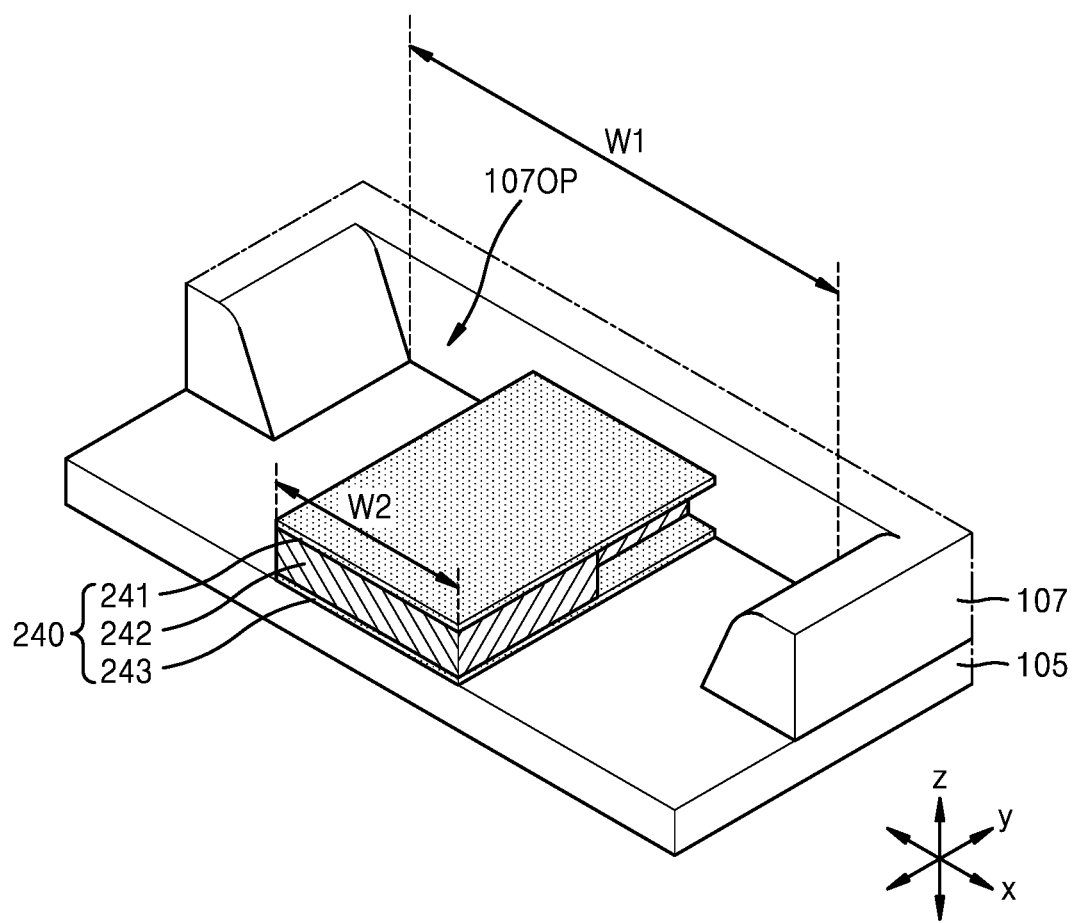
FIG. 11A is a perspective view schematically illustrating an auxiliary wiring and a first opening of a planarization insulating layer on the auxiliary wiring according to an embodiment.
Figure 11B:
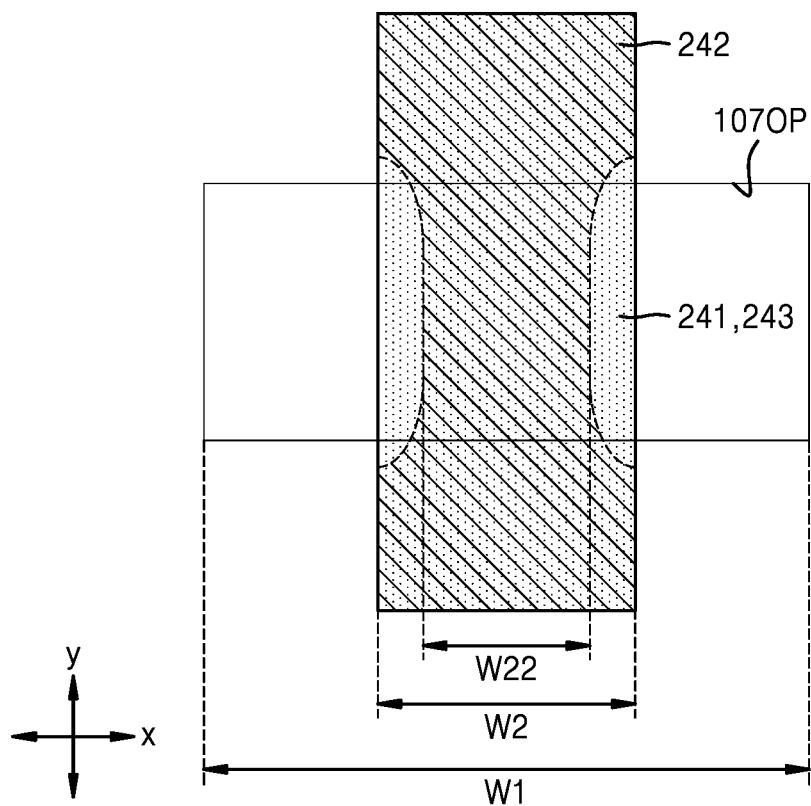
FIG. 11B is a plan view schematically illustrating FIG. 11A.

FIG. 11A is a perspective view schematically illustrating an auxiliary wiring and a first opening of a planarization insulating layer on the auxiliary wiring according to an embodiment, and FIG. 11B is a plan view schematically illustrating FIG. 11A.

Referring to FIGS. 11A and 11B, the first width W1 of the first opening 1070P of the planarization insulating layer 107 may be greater than the second width W2 of a portion of the auxiliary wiring 240 that overlaps the first opening 1070P.

A portion of the auxiliary wiring 240 overlapping a material portion of the planarization insulating layer 107 may be formed so that the upper layer 241, the main sub-layer 242, and the lower layer 243 may have comparatively a same width. On the other hand, because the portion of the auxiliary wiring 240 overlapping the first opening 1070P is etched by the etchant, as described above, the cross-sectional shapes of the upper layer 241, the main sub-layer 242, and the lower layer 243 may have the structure described above with reference to FIGS. 6 and 7 (or FIGS. 10A and 10B). In other words, the size or the area of the main sub-layer 242 overlapping the first opening 1070P may be relatively less than the size or the area of the upper layer 241. In this regard, in FIG. 11B, a solid line indicates an outline (which corresponds to a side surface in a cross-sectional view) of the upper layer 241 and/or the lower layer 243 in a plan view, and a dotted line indicates an outline (which corresponds to a side surface in the cross-sectional view) of the main sub-layer 242 in the plan view. As shown in FIG. 11B, the width of the upper layer 241 and/or the lower layer 243 may correspond to the second width W2, and a width W22 of the main sub-layer 242 may be less than a width (e.g., the second width W2) of the upper layer 241 and/or the lower layer 243.

As shown in FIG. 11B, a dotted line portion overlapping the first opening 1070P corresponds to a first contact region CCR (see FIG. 7) in which the auxiliary wiring 240 and the second electrode 330 described above with reference to FIGS. 7 and 8 directly contact each other, or a second contact region CR (see FIG. 7) in which the auxiliary wiring 240 and the auxiliary layer 340 directly contact each other.

FIGS. 11A and 11B illustrate that the auxiliary wiring 240 overlapping the first opening 1070P has a comparatively uniform width in the x direction. However, embodiments are not limited thereto. In another embodiment, as shown in FIGS. 12A, 12B, and 12C, the auxiliary wiring 240 may include a protrusion that protrudes in a direction (e.g., the x direction) intersecting an extension direction (e.g., the y direction) of the auxiliary wiring 240.

Figure 12A:
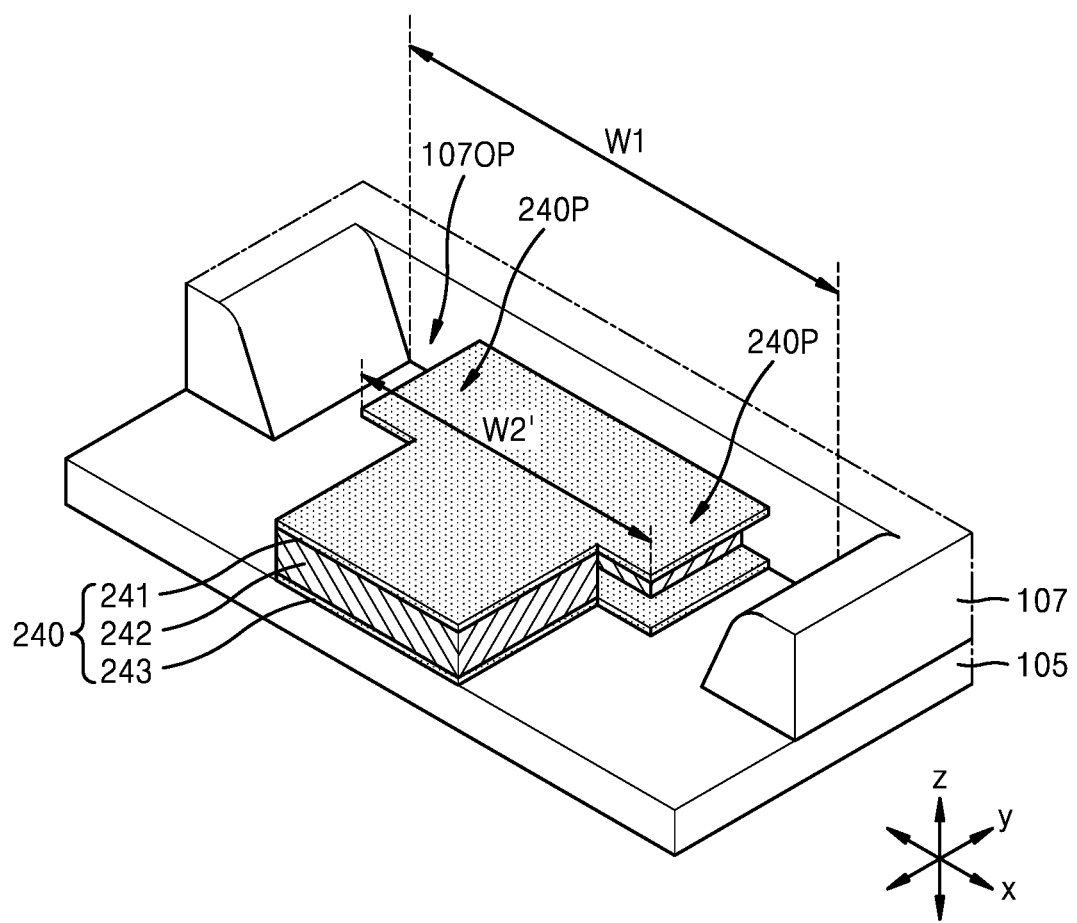
FIG. 12A is a perspective view schematically illustrating an auxiliary wiring and a first opening of a planarization insulating layer on the auxiliary wiring according to another embodiment.
Figure 12B:
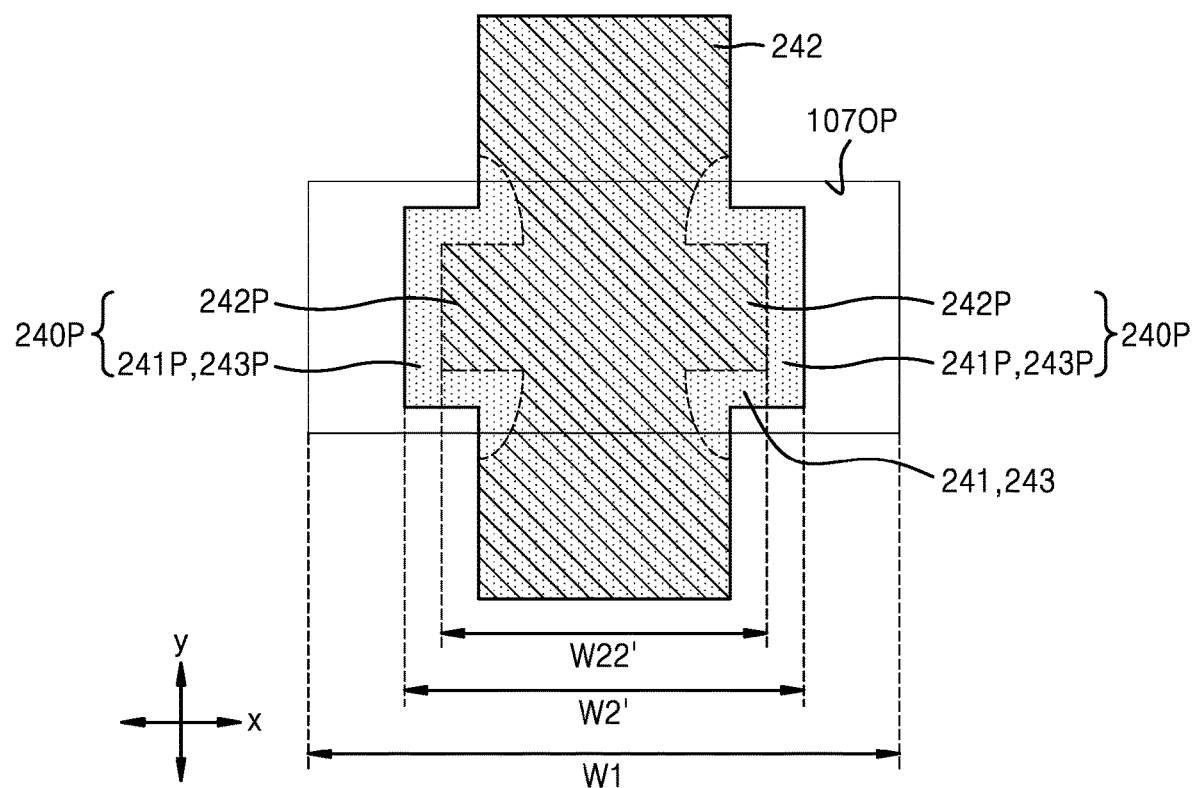
FIG. 12B is a plan view schematically illustrating an auxiliary wiring and a first opening of a planarization insulating layer according to another embodiment, which is a plan view schematically illustrating FIG. 12A.
Figure 12C:
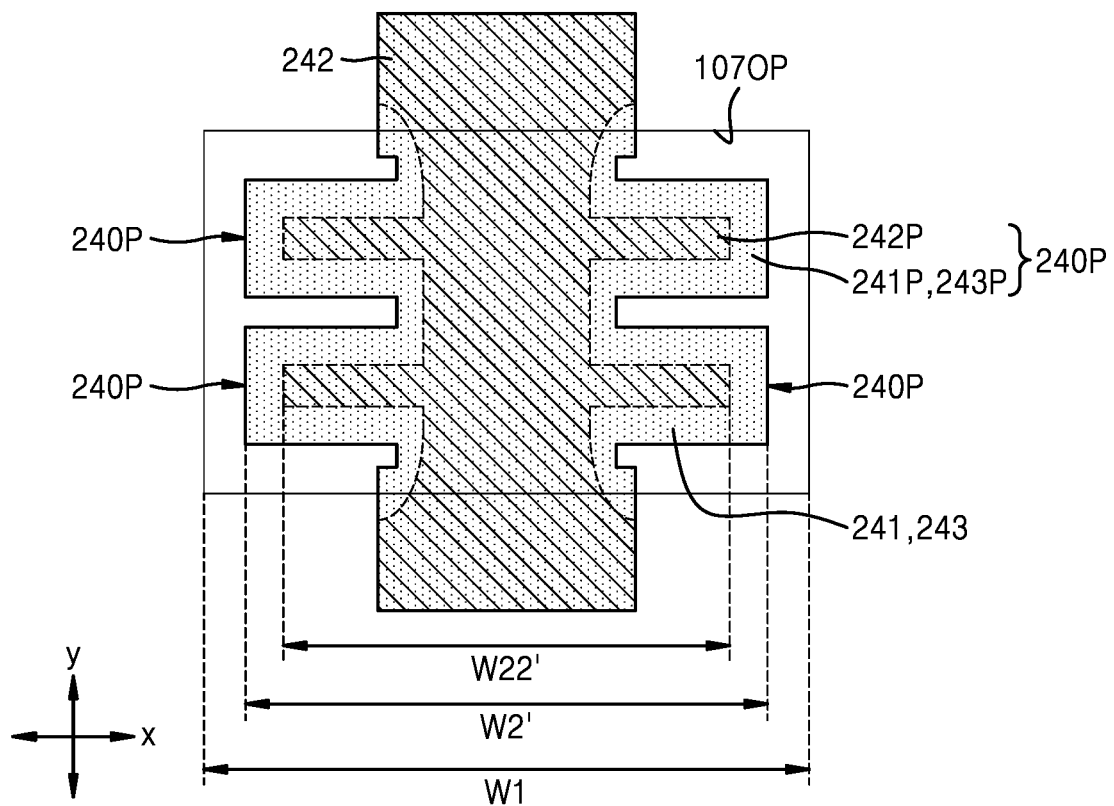
FIG. 12C is a plan view schematically illustrating an auxiliary wiring and a first opening of a planarization insulating layer according to another embodiment.

FIG. 12A is a perspective view schematically illustrating an auxiliary wiring and a first opening of a planarization insulating layer on the auxiliary wiring according to an embodiment, FIG. 12B is a schematic plan view illustrating an auxiliary wiring and a first opening of a planarization insulating layer according to an embodiment, and FIG. 12C is a schematic plan view illustrating an auxiliary wiring and a first opening of a planarization insulating layer according to an embodiment.

Referring to FIG. 12A, the auxiliary wiring 240 may include a protrusion 240P that protrudes in a direction (e.g., the x direction) intersecting the extension direction (e.g., the y direction) of the auxiliary wiring 240. For example, as shown in FIG. 12A, protrusions 240P may be arranged on both sides of the auxiliary wiring 240. FIGS. 12A and 12B illustrate that the auxiliary wiring 240 includes a pair of protrusions 240P. However, in an embodiment, the auxiliary wiring 240 may include pairs of protrusions 240P, as shown in FIG. 12C.

As the auxiliary wiring 240 includes the protrusions 240P, the upper layer 241, the main sub-layer 242, and the lower layer 243 included in the auxiliary wiring 240 may include protrusions 241P, 242P, and 243P, respectively.

The protrusions 240P of the auxiliary wiring 240 may overlap the first opening 1070P of the planarization insulating layer 107, and the first width W1 of the first opening 1070P may be greater than a second width W2' of a portion of the auxiliary wiring 240 overlapping the first opening 1070P. The second width W2' may correspond to a maximum width of a portion of the auxiliary wiring 240 overlapping the first opening 1070P. For example, in case that the protrusions 240P are arranged on both sides of the auxiliary wiring 240, the second width W2' may correspond to a distance from an end of a protrusion 240P to an end of another protrusion 240P.

A portion of the auxiliary wiring 240 overlapping (e.g., in a plan view) the first opening 1070P is etched by the etchant, as described above, and thus the cross-sectional shape of the upper layer 241, the main sub-layer 242, and the lower layer 243 may have the structure described above with reference to FIGS. 6 and 7 (or FIGS. 10A and 10B). In this regard, as illustrated in FIGS. 12B and 12C, a solid line indicates an outline (which corresponds to a side surface in a cross-sectional view) of the upper layer 241 and/or the lower layer 243 in a plan view, and a dotted line indicates an outline (which corresponds to a side surface in the cross-sectional view) of the main sub-layer 242 in the plan view. As shown in FIGS. 12B and 12C, the width of the upper layer 241 and/or the lower layer 243 may correspond to the second width W2', and a width W22' of the main sub-layer 242 may be less than a width (e.g., the second width W2') of the upper layer 241 and/or the lower layer 243.

As illustrated in FIGS. 12B and 12C, a dotted line portion overlapping the first opening 1070P corresponds to a first contact region CCR (see FIG. 7) in which the auxiliary wiring 240 and the second electrode 330 described above with reference to FIG. 7 directly contact each other, or a second contact region CR (see FIG. 7) in which the auxiliary wiring 240 and the auxiliary layer 340 directly contact each other. In other words, the first contact region CCR of the second electrode 330 and a side surface of the auxiliary wiring 240 (e.g., a side surface of the main sub-layer 242) or the second contact region CR of the auxiliary layer 340 and a side surface of the auxiliary wiring 240 (e.g., a side surface of the main sub-layer 242) may be continuous along at least one side surface of the protrusions 240P of the auxiliary wiring 240. As shown in FIGS. 12B and 12C, in case that the auxiliary wiring 240 includes the protrusions 240P, the contact area of the auxiliary wiring 240 and the second electrode 330 and the contact area of the auxiliary wiring 240 and the auxiliary layer 340 may be increased.

According to an embodiment having the above-described configuration, a display device in which a display quality may be enhanced and the area of a dead space around a display area may be reduced, may be provided. The scope of the disclosure is not limited by these effects.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   an auxiliary wiring located on a substrate;
   an insulating layer arranged on the auxiliary wiring, overlapping the auxiliary wiring in a plan view, and comprising an opening having a width greater than a width of the auxiliary wiring;
   a first electrode located on the insulating layer;
   a bank layer comprising an emission opening that overlaps the first electrode in the plan view;
   an intermediate layer overlapping the first electrode through the emission opening in the plan view and comprising an emission layer;
   a second electrode located on the intermediate layer; and
   an auxiliary layer arranged on the second electrode, wherein
   the auxiliary wiring comprises sub-layers, and
   each of the second electrode and the auxiliary layer contacts a side surface of one of the sub-layers through the opening of the insulating layer.

2. The display device of claim 1, wherein
   the sub-layers of the auxiliary wiring comprise:
   a main sub-layer;
   an upper layer arranged on the main sub-layer and having a tip protruding from a part in which a side surface and an upper surface of the main sub-layer meet each other; and
   a lower layer arranged under the main sub-layer,
   each of the second electrode and the auxiliary layer directly contacts the side surface of the main sub-layer.

3. The display device of claim 2, wherein a thickness of the main sub-layer is greater than at least one of a thickness of the upper layer and a thickness of the lower layer.

4. The display device of claim 2, wherein
   the intermediate layer overlaps the auxiliary wiring in the plan view, and
   a portion of the intermediate layer is located on the auxiliary wiring and is separated from another portion of the intermediate layer around the auxiliary wiring by the tip.

5. The display device of claim 2, wherein
   the second electrode overlaps the first electrode and the auxiliary wiring in the plan view, and
   a portion of the second electrode is located on the auxiliary wiring and is separated from another portion of the second electrode around the auxiliary wiring by the tip.

6. The display device of claim 2, wherein
   the auxiliary layer overlaps the auxiliary wiring in the plan view, and
   a portion of the auxiliary layer is located on the auxiliary wiring and is separated from another portion of the auxiliary layer around the auxiliary wiring by the tip.

7. The display device of claim 2, wherein the main sub-layer comprises at least one of copper, aluminum, platinum, palladium, silver, magnesium, gold, nickel, neodymium, iridium, chromium, lithium, calcium, and molybdenum.

8. The display device of claim 2, wherein at least one of the upper layer and the lower layer comprises at least one of indium tin oxide, titanium, molybdenum, and tungsten.

9. The display device of claim 1, wherein
   the auxiliary layer overlaps the auxiliary wiring and the opening in the plan view, and
   the auxiliary layer has a width greater than the width of the auxiliary wiring and less than the width of the opening.

10. The display device of claim 1, wherein
    the auxiliary layer overlaps the auxiliary wiring and the opening in the plan view, and
    the auxiliary layer and the second electrode have a same area in the plan view beyond the opening.

11. The display device of claim 1, wherein the auxiliary layer comprises a conductive material.

12. The display device of claim 1, further comprising:
    a lower insulating layer arranged under the auxiliary wiring,
    wherein a portion of the intermediate layer directly contacts a portion of an upper surface of the lower insulating layer through the opening of the insulating layer.

13. The display device of claim 1, wherein on a plane, the auxiliary wiring comprises protrusions protruding in a direction intersecting an extension direction of the auxiliary wiring.

14. The display device of claim 13, wherein
    the second electrode and a side surface of the auxiliary wiring contact each other in a first contact region,
    the auxiliary layer and the side surface of the auxiliary wiring contact each other in a second contact region, and
    the first contact region and the second contact region are continuous along at least one of the protrusions.

15. A display device comprising:
    a display area and a non-display area outside the display area;
    a common voltage supply line arranged in the non-display area;
    an auxiliary wiring electrically connected to the common voltage supply line and arranged in the display area;
    an insulating layer arranged on the auxiliary wiring, overlapping the auxiliary wiring in a plan view, and comprising an opening having a width greater than a width of the auxiliary wiring;
    a first electrode located on the insulating layer;
    a bank layer comprising an emission opening that overlaps the first electrode in the plan view;
    an intermediate layer overlapping the first electrode through the emission opening in the plan view and comprising an emission layer;

a second electrode located on the intermediate layer; and
an auxiliary layer arranged on the second electrode, wherein
the auxiliary wiring comprises sub-layers, and
each of the second electrode and the auxiliary layer contacts a side surface of one of the sub-layers through the opening of the insulating layer.

16. The display device of claim 15, wherein the sub-layers of the auxiliary wiring comprise:
a main sub-layer;
an upper layer arranged on the main sub-layer and having a tip protruding from a part in which a side surface and an upper surface of the main sub-layer meet each other; and
a lower layer arranged under the main sub-layer,
wherein each of the second electrode and the auxiliary layer directly contacts the side surface of the main sub-layer.

17. The display device of claim 16, wherein
the second electrode overlaps the first electrode and the auxiliary wiring in the plan view, and
a portion of the second electrode is located on the auxiliary wiring and is separated from another portion of the second electrode around the auxiliary wiring by the tip.

18. The display device of claim 16, wherein
the auxiliary layer overlaps the auxiliary wiring in the plan view, and
a portion of the auxiliary layer is located on the auxiliary wiring and is separated from another portion of the auxiliary layer around the auxiliary wiring by the tip.

19. The display device of claim 15, wherein
the auxiliary layer overlaps the auxiliary wiring and the opening in the plan view, and
the auxiliary layer has a width greater than the width of the auxiliary wiring and less than the width of the opening.

20. The display device of claim 15, wherein
the auxiliary layer overlaps the auxiliary wiring and the opening in the plan view, and
the auxiliary layer and the second electrode have a same area in the plan view beyond the opening.

21. The display device of claim 16, wherein the auxiliary layer comprises at least one of silver, magnesium, aluminum, platinum, palladium, gold, nickel, neodymium, iridium, chromium, lithium, calcium, molybdenum, indium tin oxide, gallium zinc oxide, and indium zinc oxide.

* * * * *